US007865650B2

(12) United States Patent
Marino et al.

(10) Patent No.: US 7,865,650 B2
(45) Date of Patent: Jan. 4, 2011

(54) PROCESSOR WITH COHERENT BUS CONTROLLER AT PERPENDICULARLY INTERSECTING AXIAL BUS LAYOUT FOR COMMUNICATION AMONG SMP COMPUTE ELEMENTS AND OFF-CHIP I/O ELEMENTS

(75) Inventors: Charles Francis Marino, Round Rock, TX (US); John Thomas Holloway, Jr., Austin, TX (US); Praveen S Reddy, Austin, TX (US); William John Starke, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/060,670

(22) Filed: Apr. 1, 2008

(65) Prior Publication Data

US 2009/0248946 A1    Oct. 1, 2009

(51) Int. Cl.
 *G06F 13/14* (2006.01)
(52) U.S. Cl. ........................................ 710/305; 710/306
(58) Field of Classification Search ........................ None
 See application file for complete search history.

(56) References Cited

U.S. PATENT DOCUMENTS

| 5,625,301 | A | * | 4/1997 | Plants et al. | 326/41 |
| 6,092,174 | A | * | 7/2000 | Roussakov | 712/15 |
| 6,487,651 | B1 | * | 11/2002 | Jackson et al. | 712/13 |
| 7,302,510 | B2 | | 11/2007 | Fredrickson | |
| 2004/0210738 | A1 | * | 10/2004 | Kato et al. | 712/1 |
| 2004/0266084 | A1 | * | 12/2004 | Fujishima et al. | 438/200 |
| 2006/0206657 | A1 | | 9/2006 | Clark | |
| 2007/0186027 | A1 | | 8/2007 | Klema | |

OTHER PUBLICATIONS

Hofstee—Power Efficient Processor Design and the Cell Processor, IBM (2005).
INTEL1—The Intel Pentium III Processor Family Brought Us . . . , Intel (2000).
INTEL2—The Pentium 4 Processor Takes A Leap Forward, Delivering . . . , Intel (2000).
Wang—The Cell Processor, ISSCC (2005).
Aggarwal—"Isolation in Commodity Multicore Processors", IEEE Computer Society (Jun. 2007).
Bergamaschi—"Exploring Power Management In Multi-Core Systems" Design Automation Conference, 2008 ASPDAC (Mar. 21, 2008).
Chen—"A Function-Based On-Chip Communication Design in the Heterogeneous Multi-Core Architecture", ICMUE—IEEE Computer Society (2007).

(Continued)

*Primary Examiner*—Kenneth S Kim
(74) *Attorney, Agent, or Firm*—Matt Talpis; Mark P Kahler

(57) ABSTRACT

A symmetric multi-processing (SMP) processor includes a primary interconnect trunk for communication of information between multiple compute elements situated along the primary interconnect trunk. The processor also includes a secondary interconnected trunk that may be oriented perpendicular with respect to the primary interconnect trunk. The secondary interconnect trunk communicates information off-chip via a number of I/O interfaces at the perimeter of the processor chip. The I/O interfaces may be distributed uniformly along portions of the perimeter.

23 Claims, 21 Drawing Sheets

OTHER PUBLICATIONS

Demassas—"Comparison Of Memory Write Policies for NoC Based Multicore Cache Content Systems", Design, Automation and Test in Europe (2008).

Foster—First Silicon Functional Validation and Debug of Multicore Microprocessors, IEEE Transactions on Very Large Scale Integration (VLSI) Systems (May 2005).

Gschwind—"Synergistic Processing In Cell's Multicore Architecture", IEEE Computer Society (Mar. 2006).

Kirnan—"On-Chip Optical Technology In Future Bus-Based Multicore Designs",IEEE Comp. Soc. (Jan. 2007).

Kumar—"Interconnections in Multi-core Architectures . . . ", IEEE ISCA (2005).

McCool—"Scalable Programming Models for Massively Multicore Processors", Proc. IEEE (May 2008).

Shikano—"Software-Cooperative Power-Efficient Heterogeneous Multi-Core for Media Processing", Design Automation Conference (ASPDAC) (2008).

Wagner—"MCjammer: Adaptive Verification for Multi-core Designs", (2008).

* cited by examiner

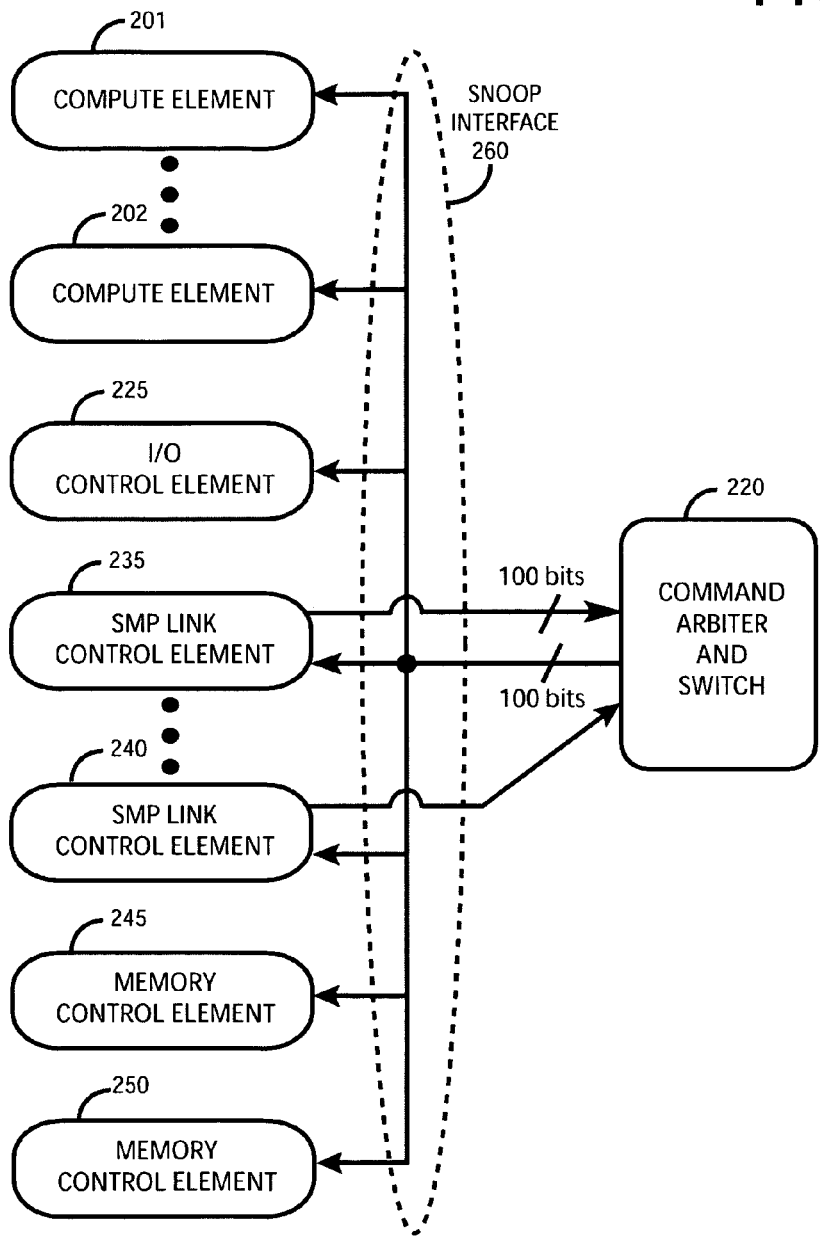

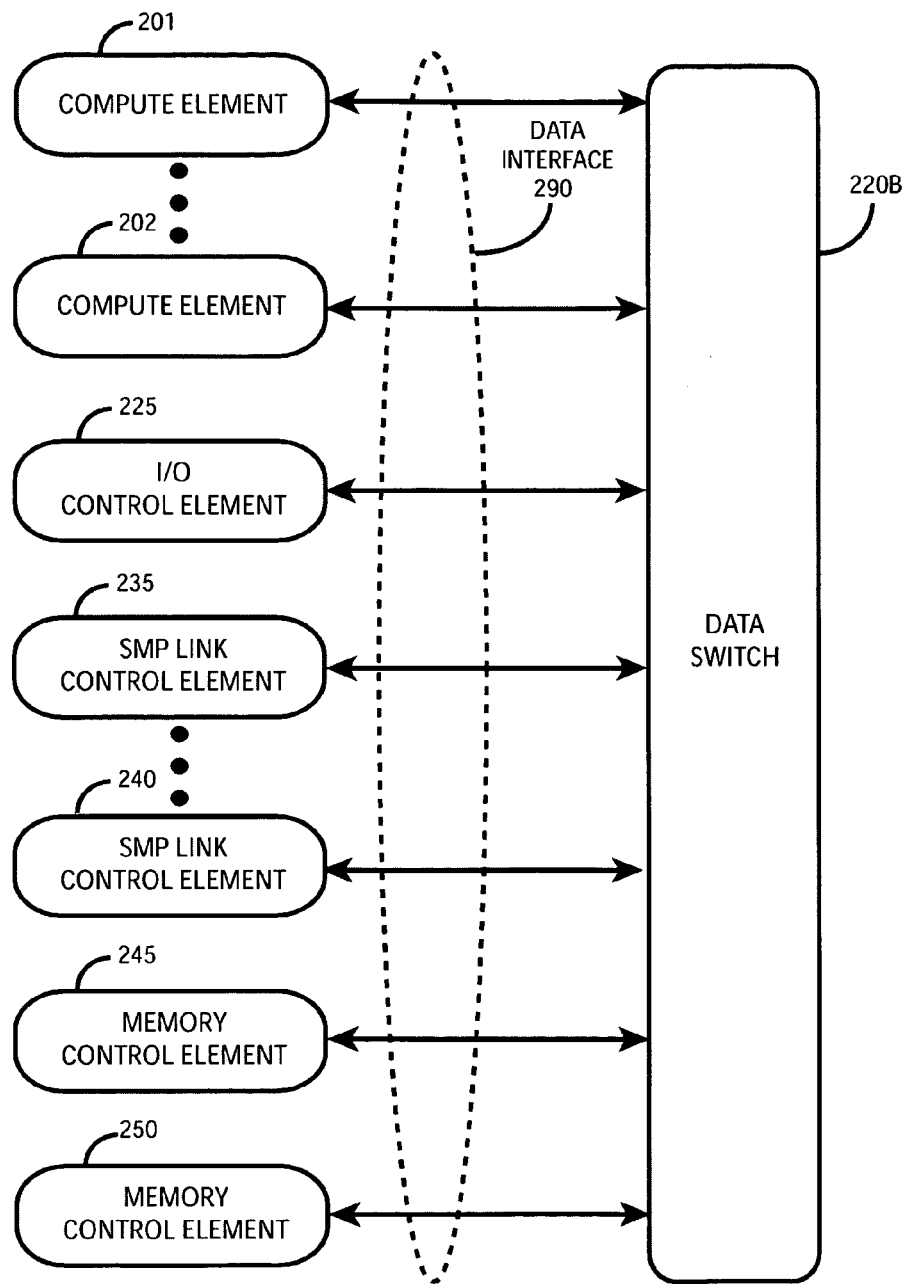

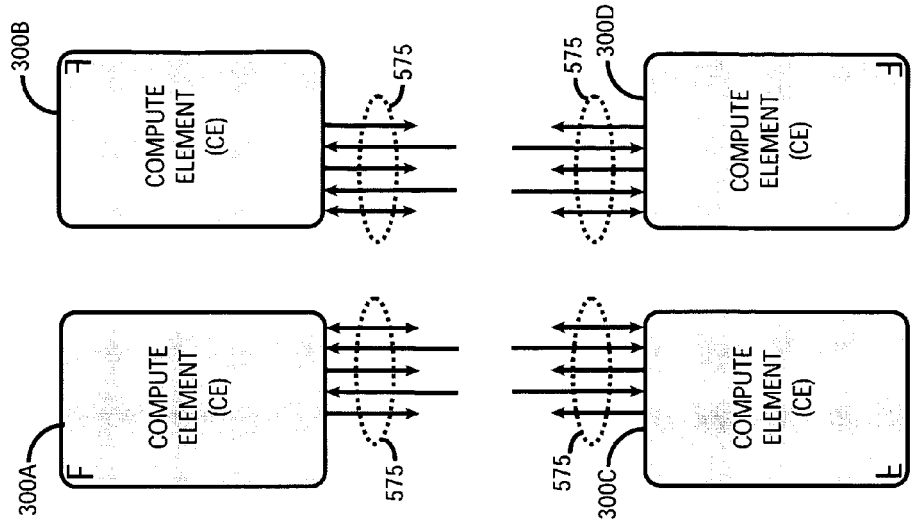
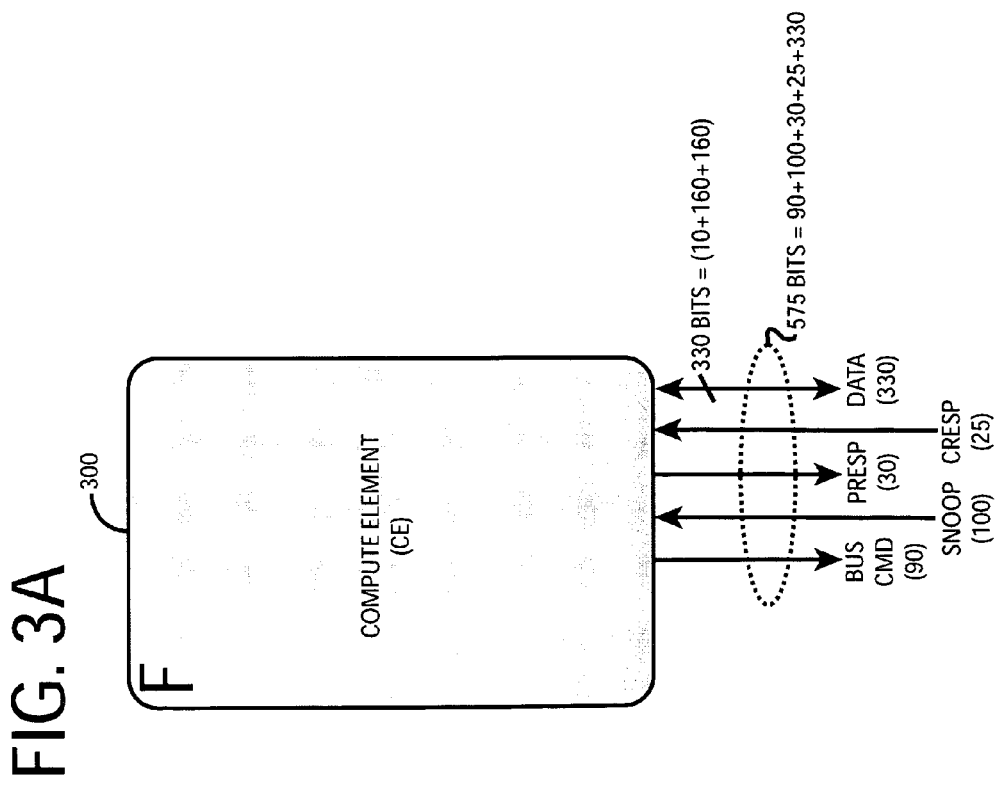
FIG. 3A

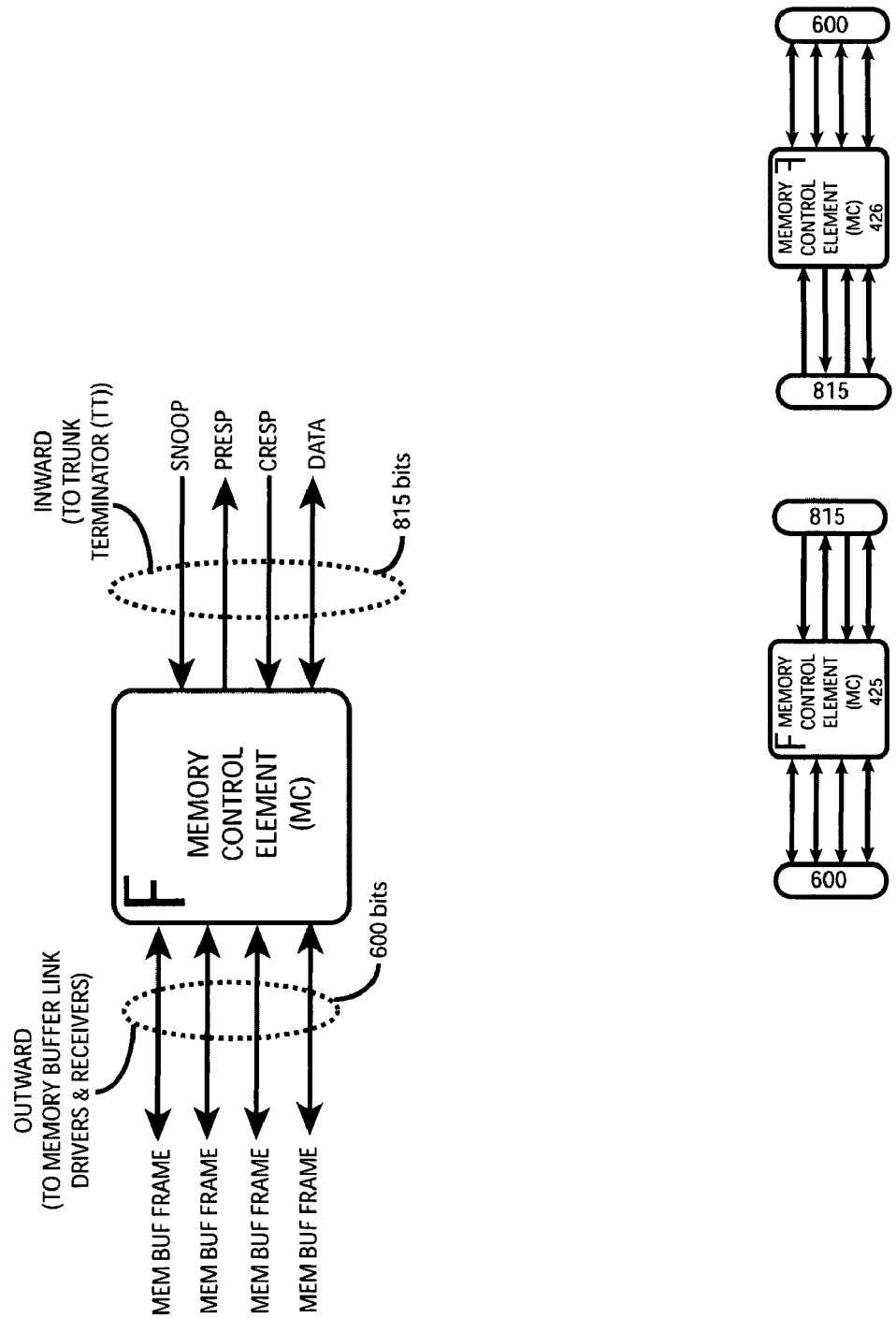

FIG. 3E
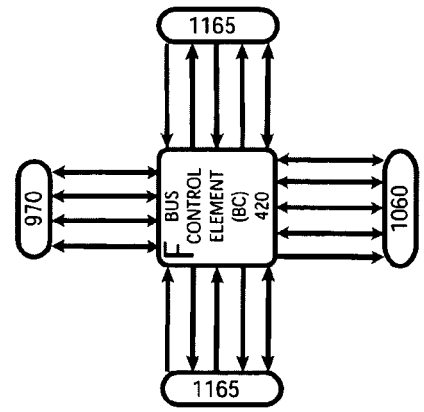
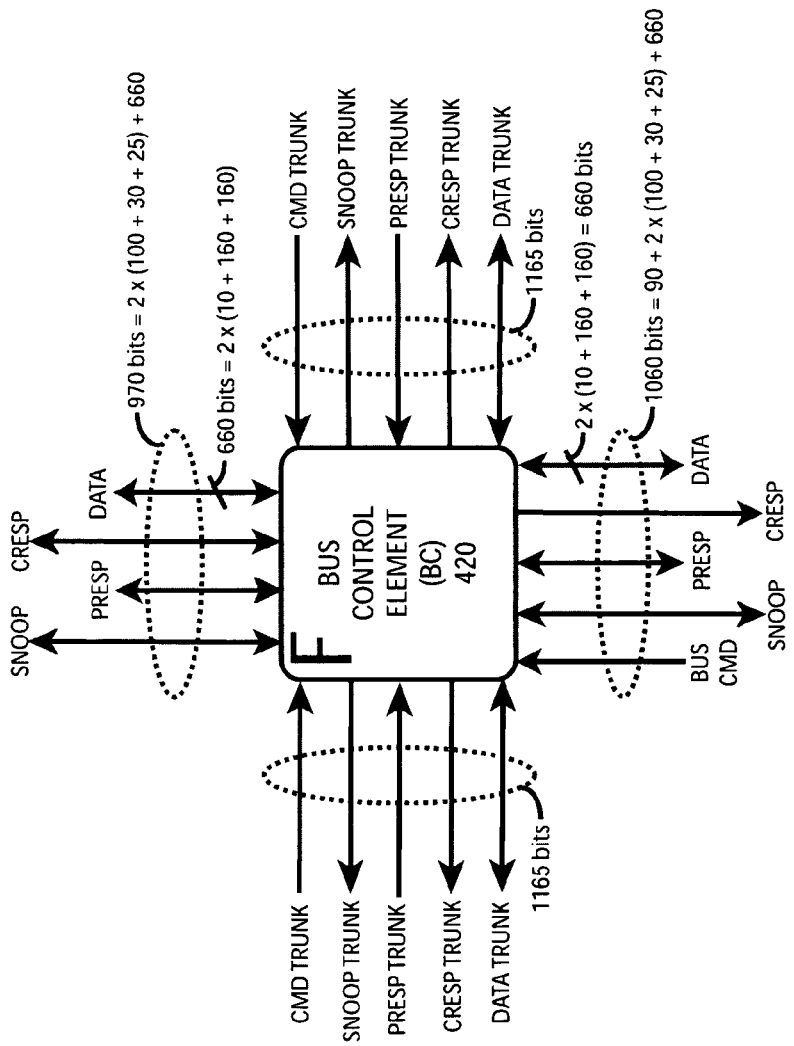

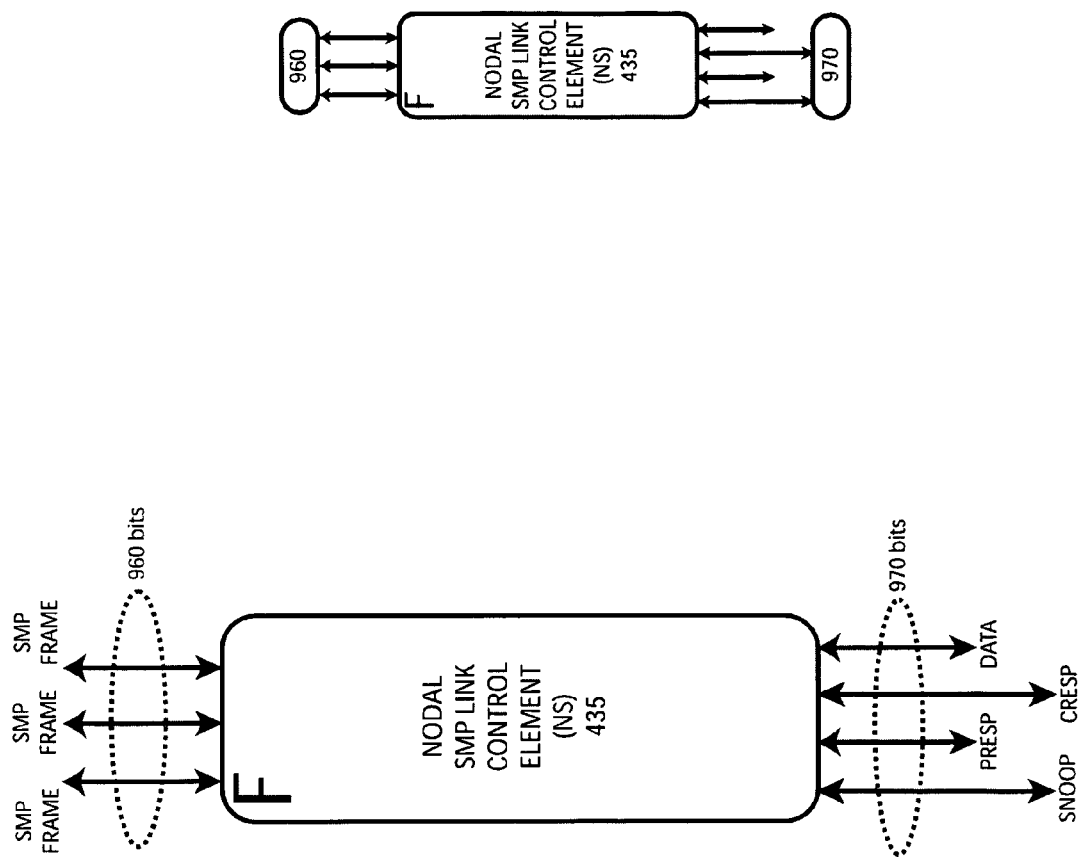

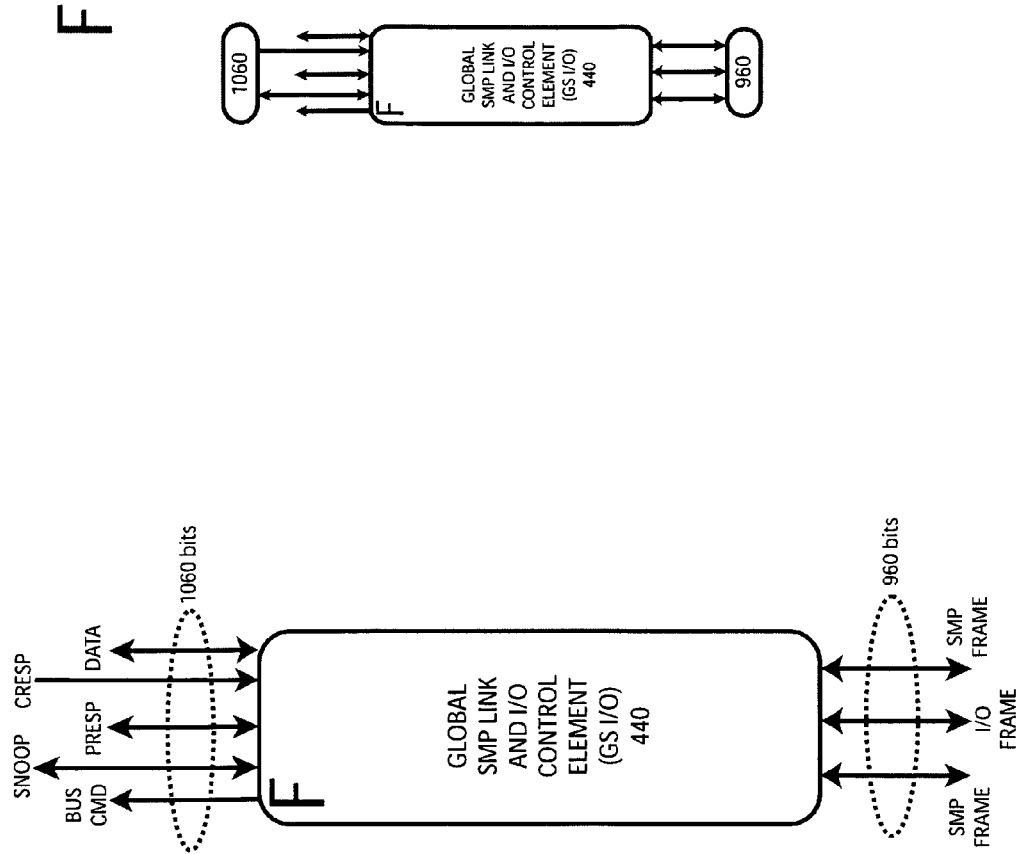

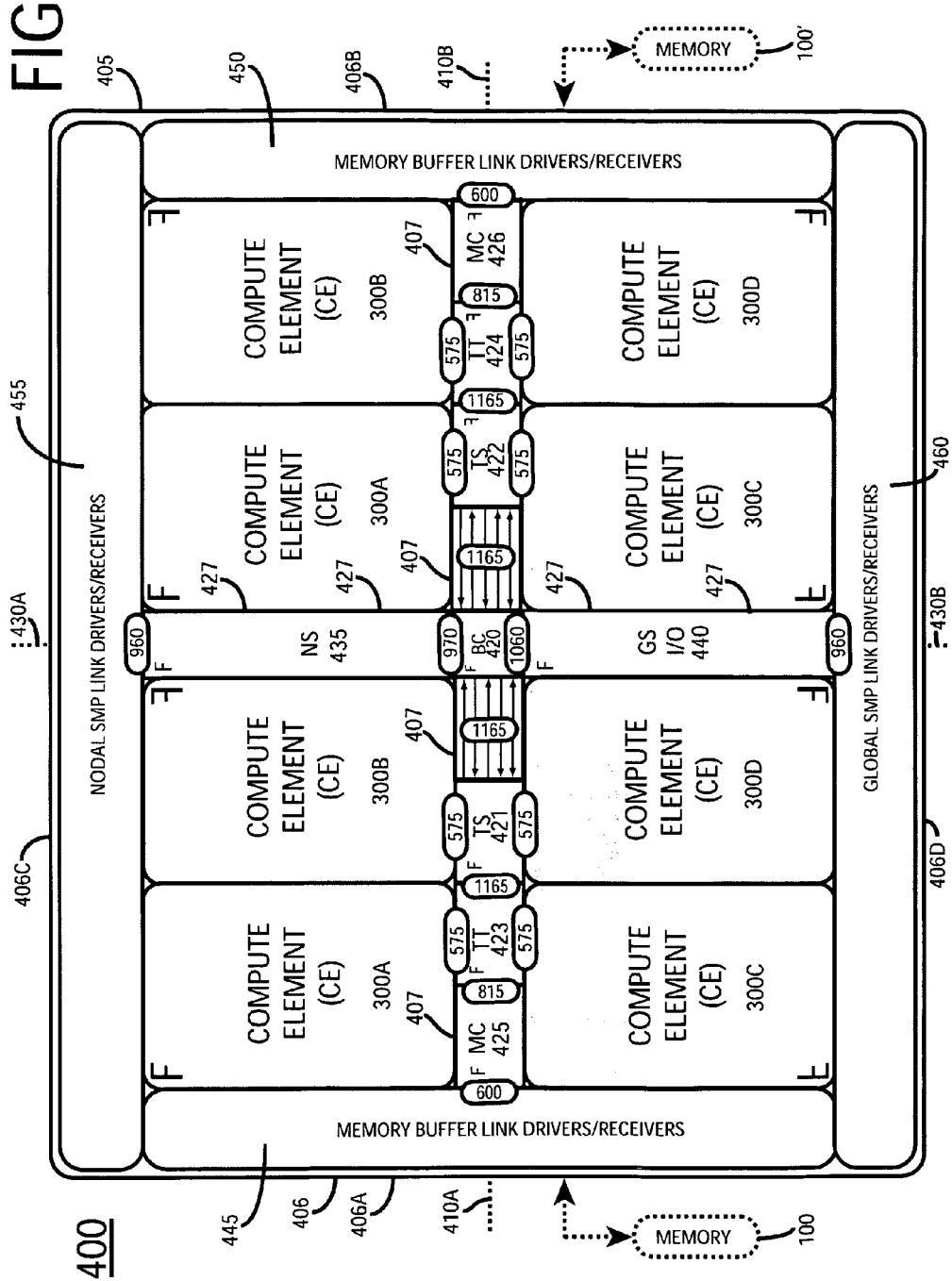

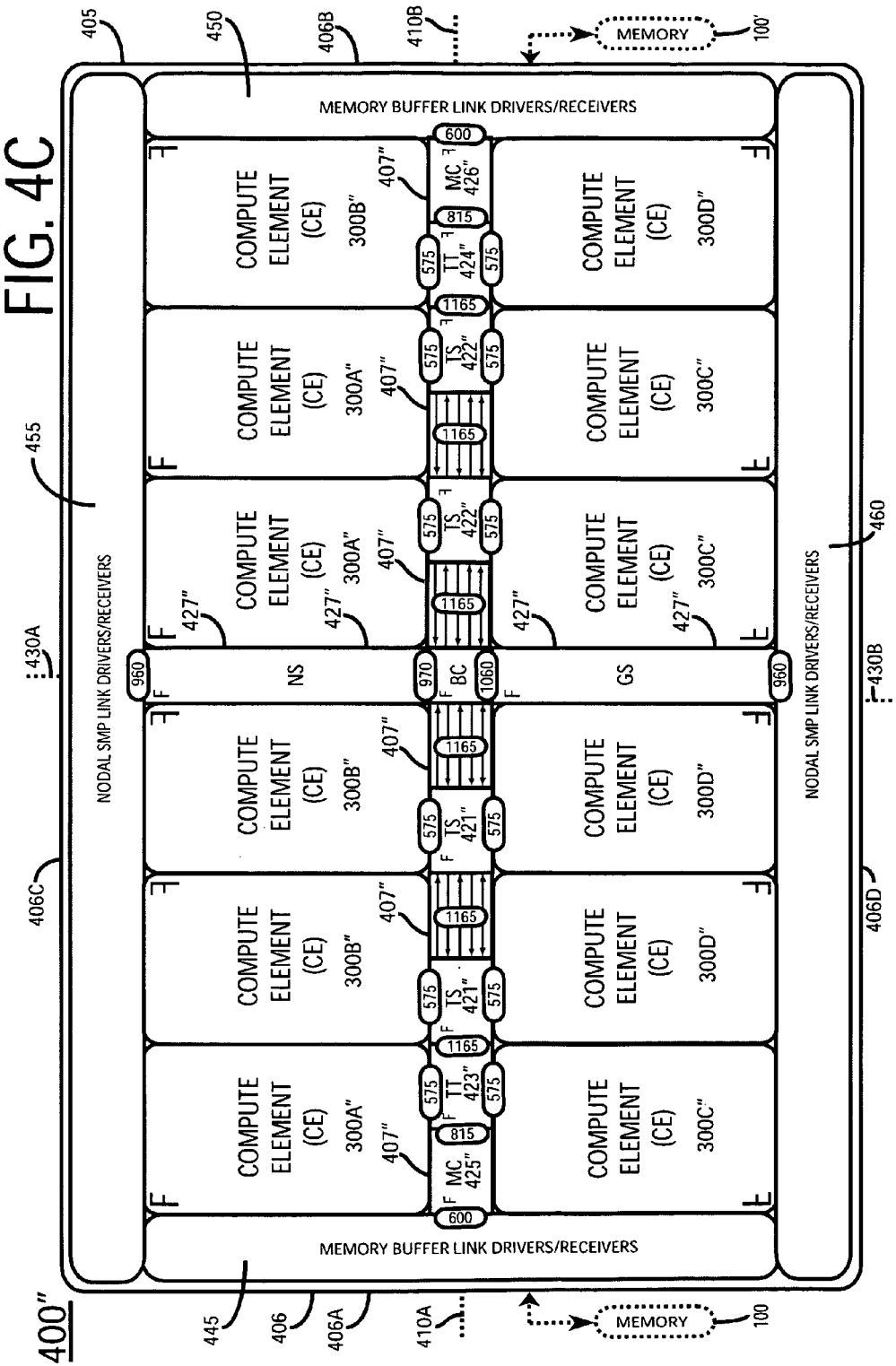

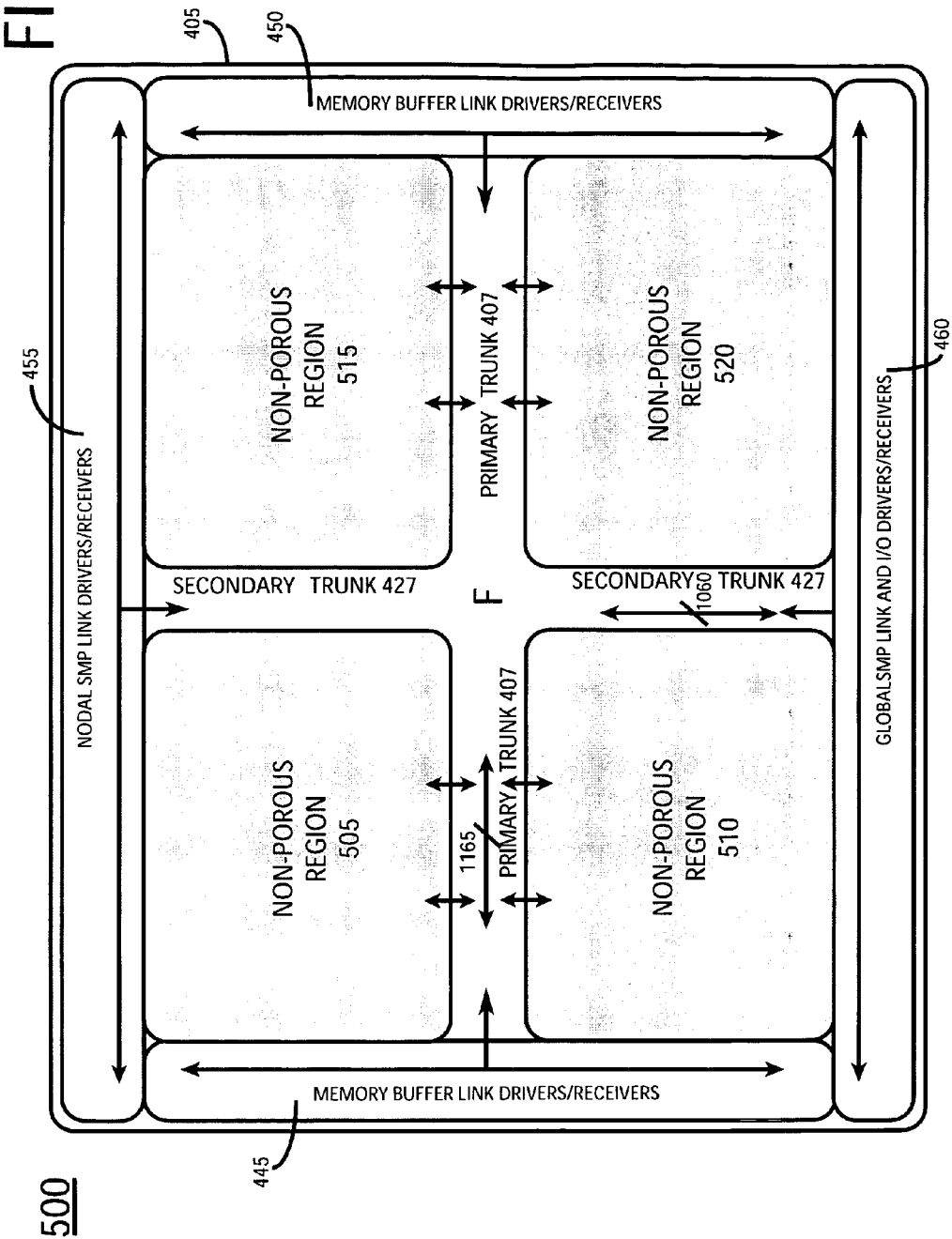

PROCESSOR WITH COHERENT BUS CONTROLLER AT PERPENDICULARLY INTERSECTING AXIAL BUS LAYOUT FOR COMMUNICATION AMONG SMP COMPUTE ELEMENTS AND OFF-CHIP I/O ELEMENTS

This invention was made with United States Government support under Agreement No. HR0011-07-9-0002 awarded by DARPA. The Government has certain rights in the invention.

CROSS-REFERENCE TO RELATED PATENT APPLICATIONS

This patent application relates to the U.S. patent application entitled "Information Handling System Including A Plurality of Multiple Compute Element SMP Processors With Primary And Secondary Interconnect Trunks", inventors Marino, et al., (Ser. No. 12/060,683, filed concurrently herewith and assigned to the same assignee).

BACKGROUND

The disclosures herein relate generally to information handling systems, and more specifically, to information handling systems that employ processors with multiple compute elements.

Modern information handling systems (IHSs) frequently use processors with multiple compute elements, compute engines or cores on a common semiconductor die. This is one way of increasing information handling system performance. A communication bus on the die connects these compute engines together to enable coordinated information processing among the compute elements. An interconnect bus is another name for a communication bus that connects the compute engines of the processor. As the number of compute elements on a processor semiconductor die increases, the number of connecting runners or wires in the interconnect bus tends to increase as well. Increases in the number of connecting runners or wires in the interconnect bus tend to cause the size of the semiconductor die to likewise increase.

BRIEF SUMMARY

In one embodiment, a processor is disclosed that includes a substrate including a perimeter. The processor includes a plurality of compute elements situated on the substrate. The processor also includes a plurality of off-chip I/O interfaces distributed along the perimeter of the substrate. The processor further includes a primary interconnect trunk, situated along a first axis of the substrate, that communicates information to and from the compute elements. The processor still further includes an secondary interconnect trunk, situated along a second axis of the substrate, that communicates information to and from the plurality of off-chip I/O interfaces, the second axis being substantially perpendicular to the first axis.

In another embodiment, a method is disclosed that includes providing a plurality of compute elements situated on a substrate that exhibits a perimeter, a plurality of off-chip I/O interfaces being distributed along the perimeter. The method also includes communicating information, by a primary interconnect trunk situated along a first axis of the substrate, to and from the compute elements. The method also includes communicating information, by a secondary interconnect trunk situated along a second axis of the substrate, to and from the plurality of off-chip I/O interfaces.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 2C shows a snoop interface between elements of the processor of the disclosed IHS.

FIG. 2G show a data interface that couples to the elements of the processor with bus master functionality in the disclosed IHS.

FIG. 3A shows different orientations of compute elements in the processor of the disclosed IHS.

FIG. 3D shows different orientations of a memory control element in the processor of the disclosed IHS.

FIG. 3E shows different orientations of a bus control element in the processor of the disclosed IHS.

FIG. 3F shows a nodal SMP link control element in the processor of the disclosed IHS.

FIG. 3G shows a global SMP link and I/O control element in the processor of the disclosed IHS.

FIG. 4A shows one embodiment of the processor of the disclosed IHS.

FIG. 4C shows yet another embodiment of the processor of the disclosed IHS.

FIG. 5 shows the non-porous regions of the processor of the disclosed IHS.

DETAILED DESCRIPTION

Figure 1:
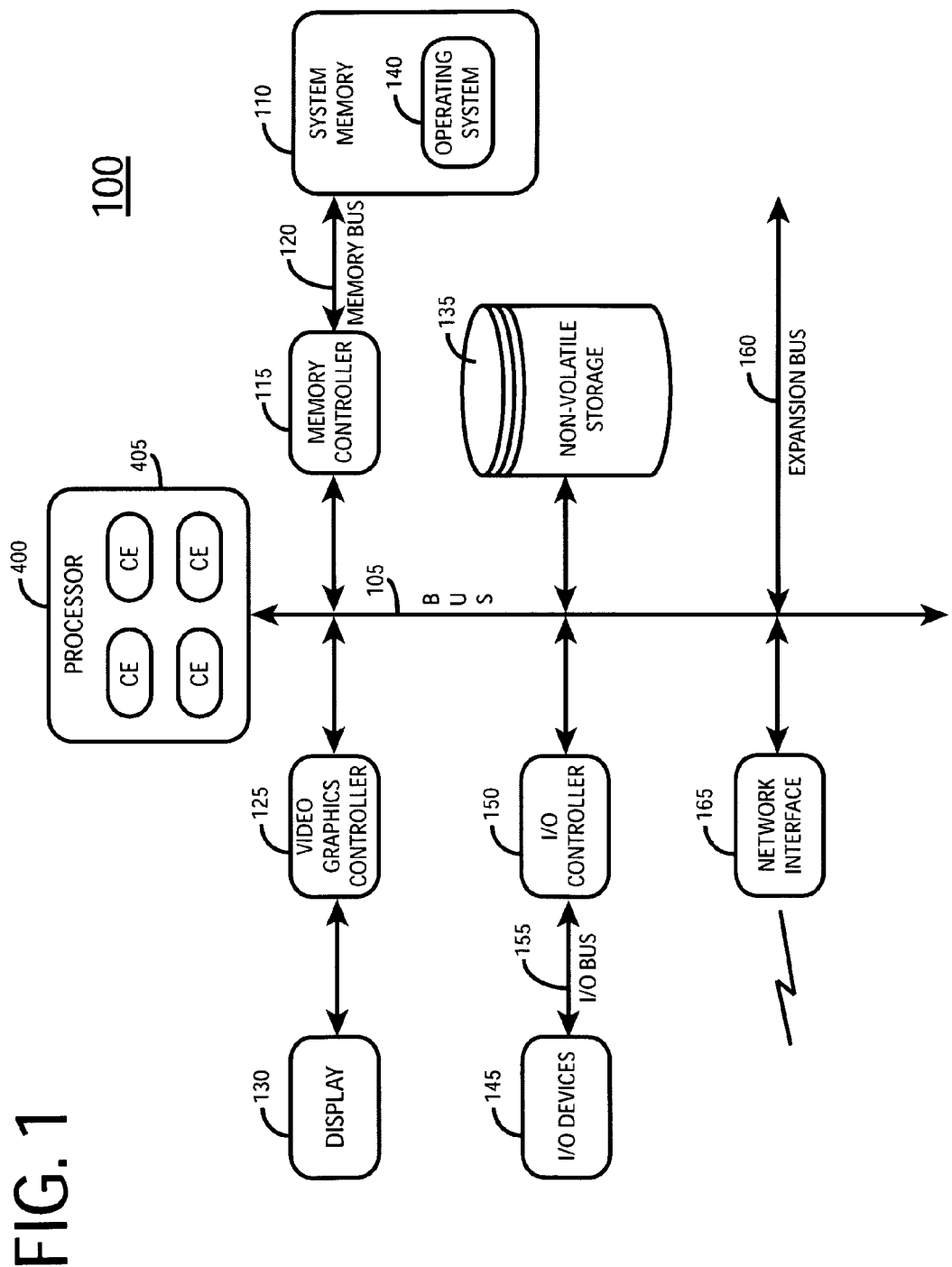
FIG. 1 shows a block diagram of one embodiment of the disclosed information handling system (IHS).

FIG. 1 shows an information handling system (IHS) 100 that includes a processor 400 having multiple compute elements (CEs) situated on a common semiconductor die 405. In one embodiment, processor 400 is an symmetric multi-processing (SMP) processor. Processor 400 is discussed in more detail below with reference to FIG. 4A. Returning to FIG. 1, an IHS is a system that processes, transfers, communicates, modifies, stores or otherwise handles information in digital form, analog form or other form. IHS 100 includes a bus 105 that couples processor 400 to system memory 110 via a memory controller 115 and memory bus 120. A video graphics controller 125 couples display 130 to bus 105. Nonvolatile storage 135, such as a hard disk drive, CD drive, DVD drive, or other nonvolatile storage couples to bus 105 to provide IHS 100 with permanent storage of information. An operating system 140 loads in memory 110 to govern the operation of IHS 100. I/O devices 145, such as a keyboard and a mouse pointing device, couple to bus 105 via I/O controller 150 and I/O bus 155. One or more expansion busses 160, such as USB, IEEE 1394 bus, ATA, SATA, PCI, PCIE and other busses, couple to bus 105 to facilitate the connection of peripherals and devices to IHS 100. A network interface adapter 165 couples to bus 105 to enable IHS 100 to connect by wire or wirelessly to a network and other information handling systems. While FIG. 1 shows one IHS that employs processor 400, the IHS may take many forms. For example, IHS 100 may take the form of a desktop, server, portable, laptop, notebook, or other form factor computer or data processing system. IHS 100 may take other form factors such as a gaming device, a personal digital assistant (PDA), a portable telephone device, a communication device or other devices that include a processor and memory.

Figure 2A:
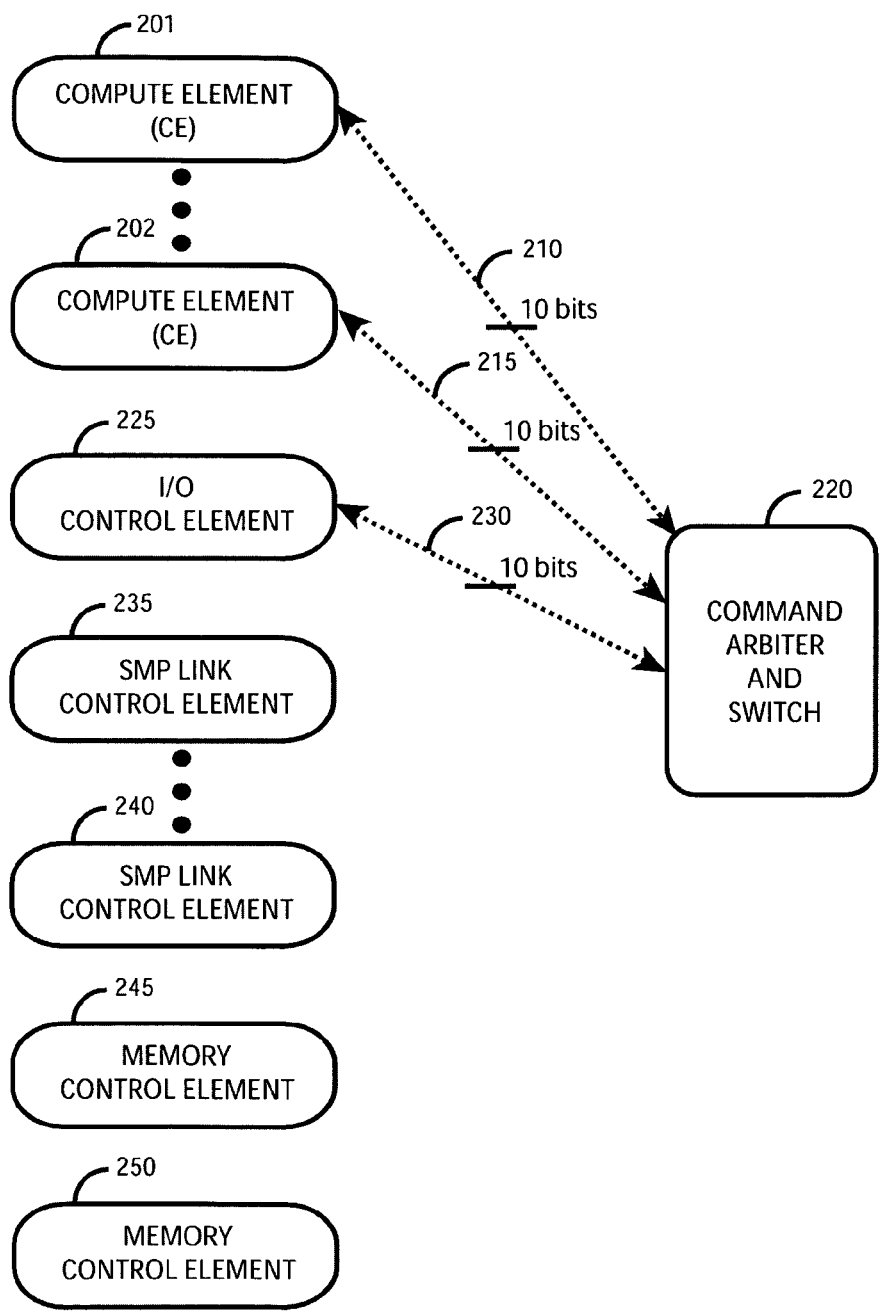
FIG. 2A shows illustrative request/grant interface logical connectivity between elements with bus master functionality and a command arbiter and switch in a processor of the disclosed IHS.

Before describing an embodiment of processor 400, a number of components or building blocks that are usable to form processor 400 are first discussed below. FIGS. 2A-2G show logical constructs in the multiple compute element processor 400 with focus on logical constructs involved in the transport of coherence protocol information and the transport of data among compute elements. As noted above, processor 400 includes multiple compute element (CEs). For example, in one embodiment processor 400 includes four or more compute elements such as compute elements 201 and 202 shown in FIG. 2A. A compute element such as compute element 201 may take the form of a processor core. Compute elements are substantially non-porous in the sense that connective wire runners unrelated to a particular compute element may not cross the particular compute element's area or real estate on a semiconductor die. In the example of FIG. 2A, compute elements such as compute elements 201 and 202 couple or connect via 10 bit request/grant busses 210 and 215, respectively, to a command arbiter and switch 220. Busses 210 and 215 may employ bit widths other than 10 bits. The bit widths of busses, interfaces and other structures in this document are representative and should not be taken as limiting.

A compute element such as compute element 201 may send a request to send a coherence command to command arbiter and switch 220. FIG. 2A shows illustrative request/grant interface logical connectivity between elements with bus master functionality such as compute elements 201 and 202 and command arbiter and switch 220. Command arbiter and switch 220 may form part of a centralized per-chip coherence command arbiter in a bus control element located on the semiconductor die. Centralized per-chip coherence command arbiter or coherence command arbiter are other terms for command arbiter and switch 220. FIG. 2A also shows an I/O control element 225 that couples to command arbiter and switch 220 via a 10 bit request/grant bus 230. I/O control element 225 is an example of one I/O control element that enables off-chip communications, namely communication with processors on other semiconductor dies or chips.

FIG. 2A also shows symmetric multi-processor (SMP) link control elements such as SMP link control elements 235 and 240 that are usable for off-chip communications with other SMP type processors. FIG. 2A further shows memory control elements 245 and 250 that may communicate with off-chip memory. In other words, memory control elements 245 and 250 enable I/O activities with respect to off-chip memory. Processor 400 may thus communicate with off-chip memory as well as other processors such as off-chip SMP processors. Coherence commands provide a mechanism by which elements such as compute elements 201, 202 and I/O control element 225 may request access to blocks of storage or off-chip memory. In response to a request from a requesting element such as compute element 201 on request/grant bus 210, the centralized per-chip coherence command arbiter 220 may grant permission for the requesting element to send a coherence command. Command arbiter 220 may send a grant response to the requesting element, namely compute element 201, on the same request/grant bus 210.

Figure 2B:
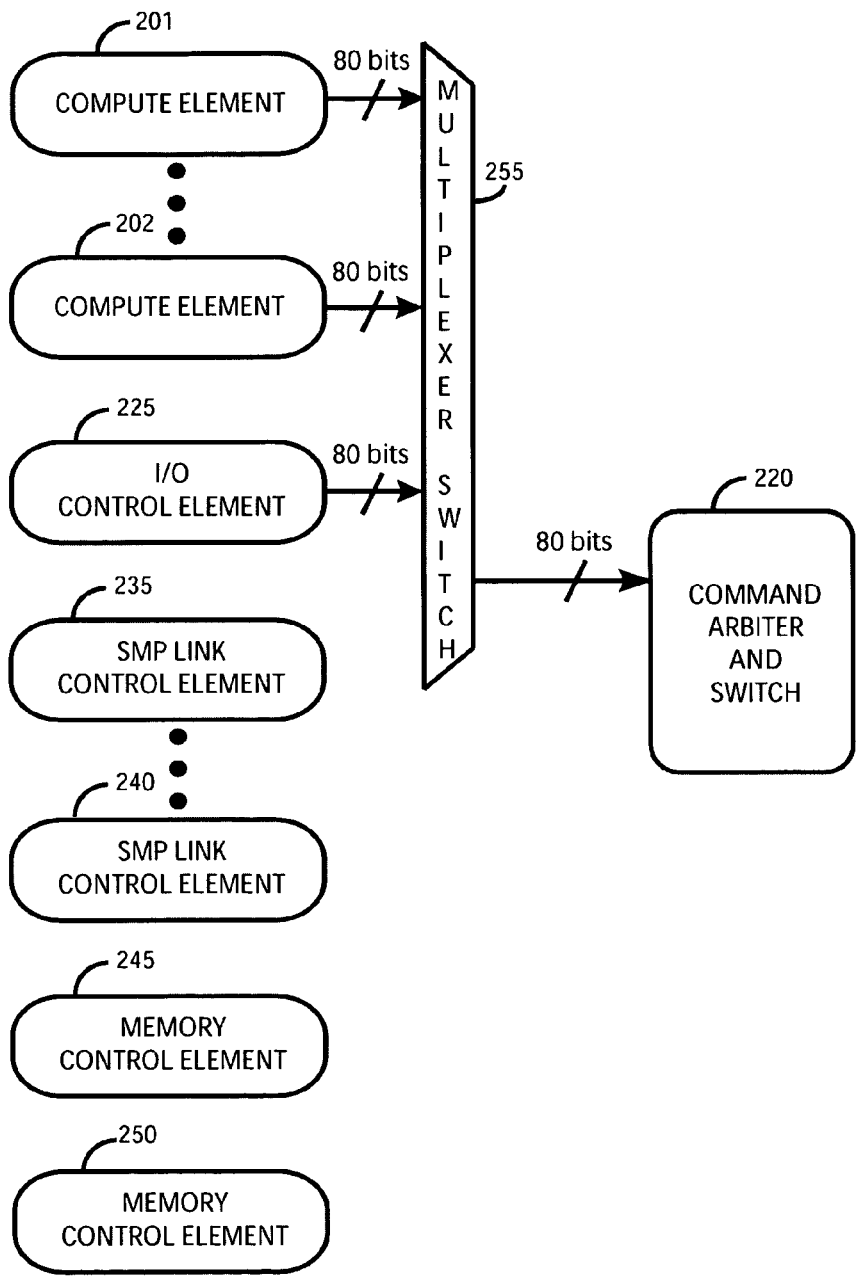
FIG. 2B shows multiple compute elements coupled via a multiplexer to the command arbiter and switch.

FIG. 2B shows the same elements as FIG. 2A except that compute elements 201 and 202 and I/O control element 225 couple to command arbiter and switch 220 via a multiplexer switch 255. In this particular example, multiplexer switch 255 is an 80 bit multiplexer switch that supports an 80 bit coherence command that the requesting element sends to command arbiter and switch 220. Again, bit width values in this document are examples and should not be taken as limiting. Once the centralized per-chip coherence command arbiter 220 grants permission to the requesting element to send a coherence command, multiplexer switch 255 routes the coherence command from the requesting element to coherence command arbiter 220. FIG. 2B illustrates command interface logical connectivity between elements with bus master functionality, such as compute elements 201, 202 and I/O control element 225, and centralized per-chip coherence arbiter and switch 220. A snoop interface may carry coherence command and associated routing and control information to elements with bus snooper functionality in processor 400.

FIG. 2C shows a snoop interface 260, in terms of bit width, that couples between the centralized per-chip coherence command arbiter switch 220 to those elements exhibiting bus snooper functionality. Those elements exhibiting bus snooper functionality include compute elements 201, 202, I/O control element 225, SMP link control elements 235, 240 and memory control elements 245, 250. The purpose of SMP link control elements 235, 240 is to route snoop content to other chips, namely other processors with SMP capability. In one embodiment, those other chips are off-chip with respect to processor 400. Those other chips with SMP capability may include other chips similar to processor 400. Such other chips with SMP capability may include a centralized per-chip coherence command arbiter switch like coherence arbiter and switch 220. Such other chips with SMP capability may also include SMP link control elements like SMP link control elements 235, 240. Processor 400 sends snoop content via SMP link control elements 235, 240 to other chips or processors with SMP capability, namely recipient processors (not shown). When the snoop information arrives at a recipient SMP link control element of other chips or processors with SMP capability, the recipient SMP link control element sends the snoop information to the centralized per-chip coherency command switch of that particular recipient processor. The centralized per-chip coherency command arbiter switch of that recipient processor then re-distributes the snoop information to elements exhibiting bus snooper functionality within the recipient processor. Processor 400 also distributes the snoop information on-chip, that is to those elements of processor 400 that exhibit bus snooper functionality.

The purpose of snoop interface 260 is to enable the maintenance of coherency of data within memory blocks (not shown) that are off-chip with respect to processor 400. Elements that exhibit bus snooper functionality on-chip, i.e. within processor 400, as well as elements that exhibit bus snooper functionality on another chip, i.e. off-chip with respect to processor 400 but on another chip, may attempt to access memory blocks. Snoop interface 260 assists in maintaining memory coherency. Different elements may maintain copies of data in off-chip memory. Snoop interface 260 aids in tracking of which copies of a data block in memory are currently valid. An element exhibiting bus snooper functionality is an example of a snooper. A snooper sends a partial response to command arbiter and switch 220. Partial responses (PRESPs) communicate a snooper's authorization state with respect to a given requested storage block of data in memory. Partial responses (PRESPs) by snoopers may also communicate denial of access to a requested storage block of data by a snooper for a number of reasons.

Figure 2D:
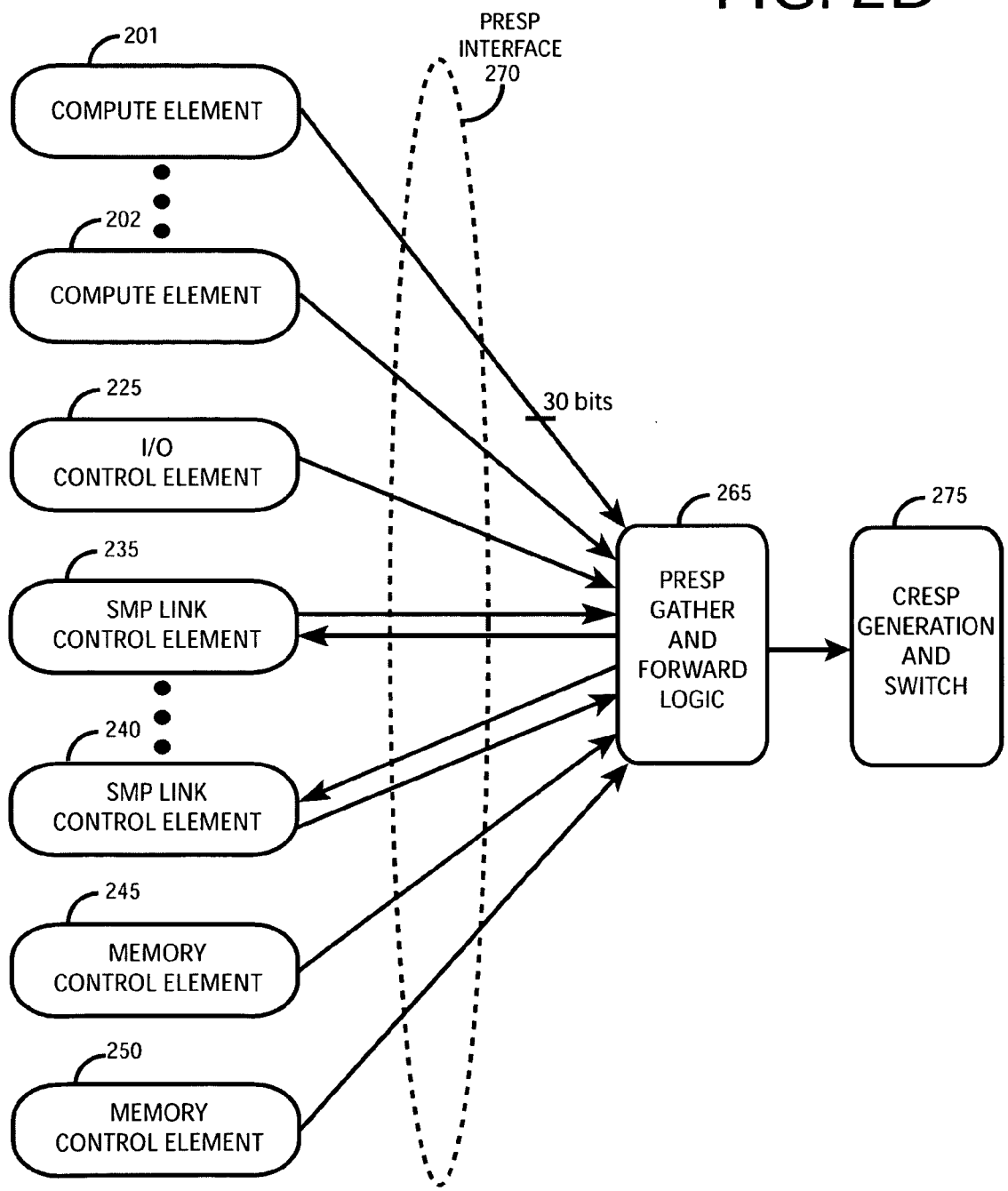
FIG. 2D illustrates partial response (PRESP) interface logical connectivity between elements exhibiting bus snooper functionality in the processor of the disclosed IHS.

FIG. 2D illustrates partial response (PRESP) interface logical connectivity, in terms of bit width, between elements exhibiting bus snooper functionality and centralized per-chip PRESP gathering and forwarding logic 265. Partial responses (PRESPs) from snoopers on processor chips other than processor 400's chip or die ultimately route back via an SMP link control element to a master element's processor chip. A master element is the requesting element that initiates the coherence command for which PRESP gather and forward logic 265 collects PRESPs. On a particular processor chip 400, elements that snoop communicate their respective partial responses (PRESPs) via PRESP interface 270. Those elements that snoop include compute elements 201, 202, I/O control element 225, SMP link control elements 235, 240 and memory control elements 245, 250. PRESP gathering and forwarding logic 265 couples to CRESP generation and switch logic 275.

Figure 2E:
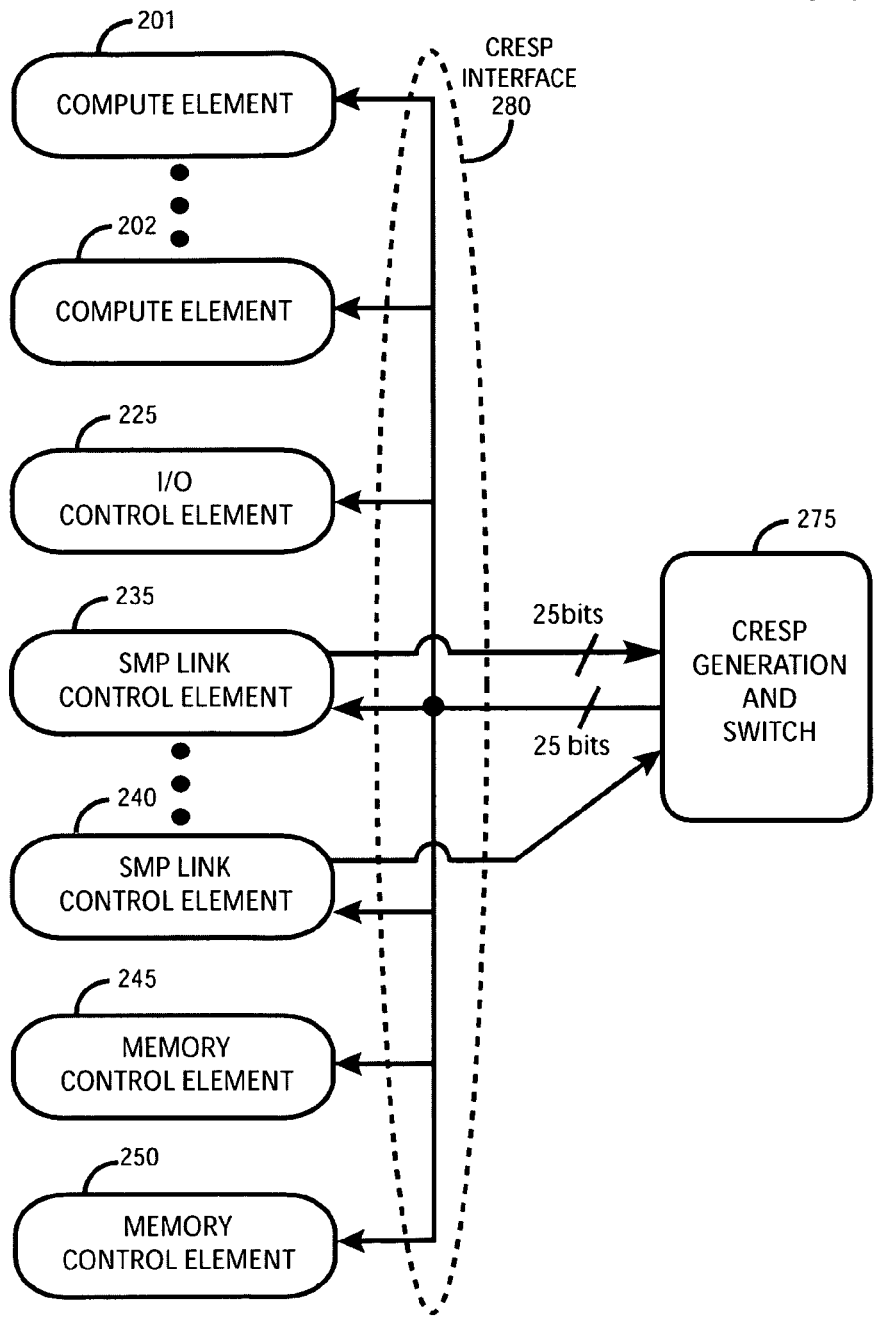
FIG. 2E shows combined response (CRESP) generation and switch logic that couples via a CRESP interface to elements that snoop in the processor of the disclosed IHS.

FIG. 2E shows combined response (CRESP) generation and switch logic 275 that couples via CRESP interface 280 to elements that snoop. As described above with reference to FIG. 2D, partial responses (PRESPs) from snoopers on processor chips other than the processor 400 chip route back via an SMP link control element to a master element's processor chip, such as processor chip 400. At this point, combined response generation (CRESP) logic 270 of FIG. 2D and FIG. 2E consolidates partial responses (PRESPs) to drive a single centralized memory authorization decision, namely the combined response (CRESP). FIG. 2E shows the combined response (CRESP) interface 280 that communicates the combined response (CRESP) back to the elements that snoop, both on-chip and off-chip (i.e. on another processor chip other than processor 400). FIG. 2E shows illustrative CRESP interface 280 logical connectivity, in terms of bandwidth, from a centralized per-chip CRESP generator and switch 275 to all elements with master and snooper functionality, including SMP link control elements whose purpose is to route CRESP content to processor chips other than processor 400, namely a recipient SMP processor. Upon arrival of the CRESP content at SMP link control elements of a recipient SMP processor, those SMP link control elements supply the CRESP content to a centralized per-chip CRESP generation switch on the recipient SMP processor. The centralized per-chip CRESP generation switch of the recipient SMP processor redistributes the CRESP content to snoopers within the recipient SMP processor. As a consequence of many coherence authorization decisions by a centralized CRESP generator and switch on a processor such as processor 400, the particular data that associates with a storage block may transfer from a current owner to a new owner or repository memory location.

Figure 2F:
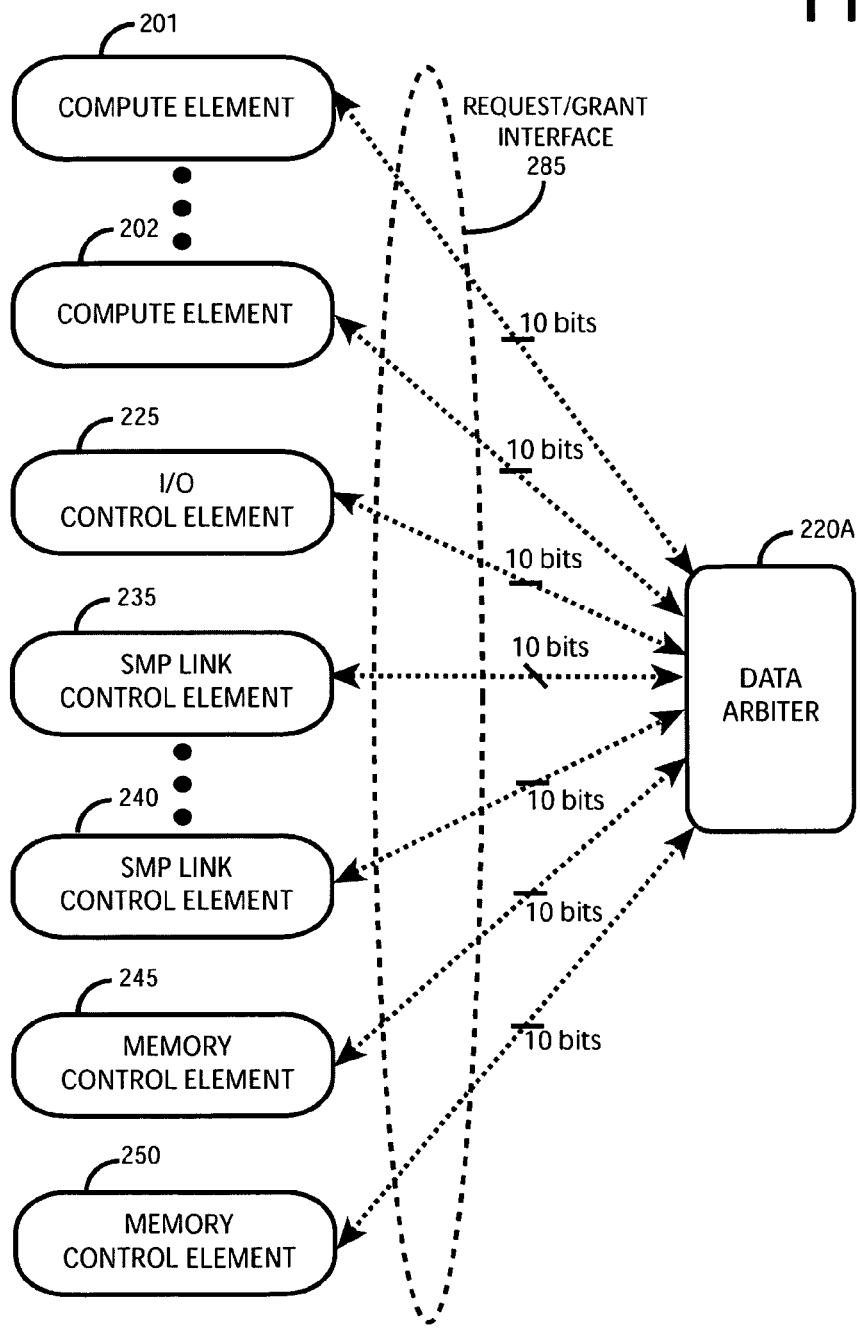
FIG. 2F shows more detail with respect to the request/grant interface between elements with bus master functionality and the centralized per-chip data arbiter.

FIG. 2F shows more detail with respect to the request/grant interface 285 between elements with bus master functionality and the centralized per-chip data arbiter 220A. Centralized per-chip data arbiter and switch 220 includes a data arbiter 220A, shown in FIG. 2F, and a data switch 220B, shown in FIG. 2G. Referring now to FIG. 2F, each element with bus master capability communicates with data arbiter 220A via a respective 10 bit bus within request/grant interface 285. In this embodiment, elements 201, 202, 225, 235, 240, 245 and 250 exhibit bus master functionality.

FIG. 2G shows a data interface 290 that couples to the elements of processor 400 with bus master functionality, namely elements 201, 202, 225, 235, 240, 245 and 250. Once the centralized per-chip data arbiter 220A of FIG. 2F grants permission for the requesting element to send a data block of memory storage, processor 400 routes the data block through data switch 220B of FIG. 2G to a recipient element. FIG. 2G thus illustrates data interface logical connectivity between elements with bus master functionality and centralized per-chip data switch 220B.

Figure 3B:
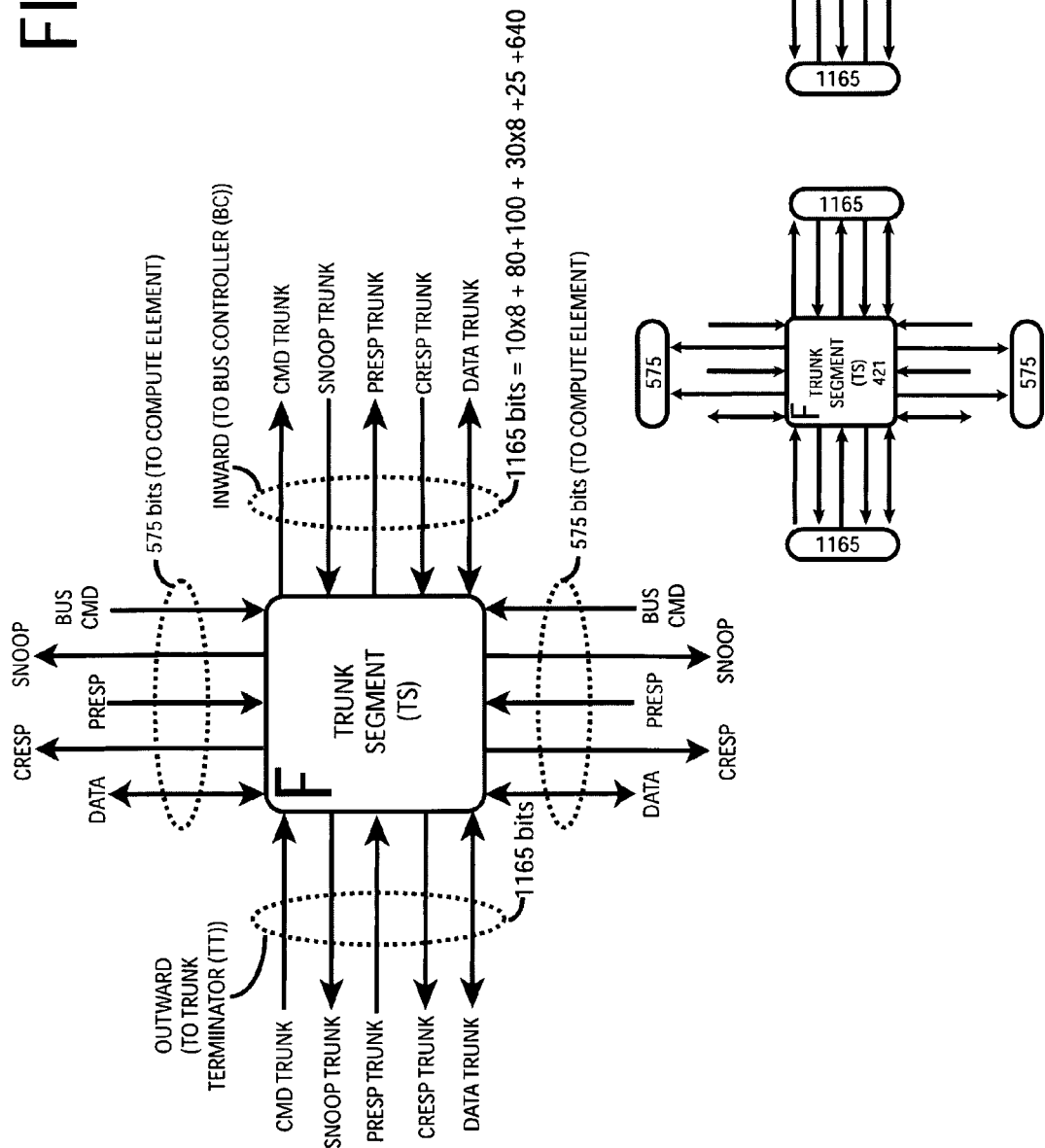
FIG. 3B shows different orientations of a trunk segment in the processor of the disclosed IHS.

FIG. 3A-3G illustrate a set of physical building blocks that processor 400 employs to provide the functionality shown and described in FIGS. 2A-2G. FIG. 3A shows a compute element (CE) 300 that may include a processor core or cores and associated cache hierarchy. In some embodiments, compute element 300 may include a specialized accelerator or co-processor, or other functional element. The letter "F" in the upper left corner of compute element 300 indicates the spatial orientation of compute element 300. Compute elements 300A, 300B, 300C and 300D depict 4 different orientations of compute element 300. Compute element 300A exhibits the same orientation as enlarged compute element 300 on the left of FIG. 3A. The unchanged "F" in the upper left corner of compute element 300A exhibits the same orientation as the "F" in the upper left corner of enlarged compute element 300. A processor designer may flip or mirror compute element 300 about its vertical axis to form compute element 300B as indicated by the flipped or mirrored "F" in the upper right corner of compute element 300B. The processor designer may flip or mirror compute element 300A about its horizontal axis to form compute element 300C as indicated by the flipped or mirrored "F" in the lower left corner of compute element 300C. The processor designer may flip or mirror compute element 300B about its horizontal axis to form compute element 300D as indicated by the flipped or mirrored "F" in the lower right corner of compute element 300D.

Compute element 300 operates as a bus master for coherence commands as indicated by its bus command (BUS CMD) input. The numeral 90 in parentheses adjacent the BUS CMD input indicates the bit width of that input. This document uses such bit widths in conjunction with names to identify inputs, outputs, and busses of processor 400. The BUS CMD (90) output will couple to 90 wire runners or interconnects in processor 400 as described below in more detail. Once again, the bit widths described in this document are illustrative and not to be taken as limiting.

Compute element 300 operates as a snooper for coherency commands via SNOOP (100) output. The SNOOP output is a 100 bit output in this particular example. When operating as a snooper, compute element 300 provides partial responses (PRESPs) at the PRESP (30) output and reacts to combined responses (CRESPs) received at the CREPS (25) input. Compute element 300 includes data input/output DATA (330). Input/output DATA (330) sends 160 bits of data plus control words and receives 160 bits of data plus control words. Input/output (330) includes 10 bits of data from request/grant control interface 285 of FIG. 2F. Returning to FIG. 3A, BUS CMD (90), SNOOP (100), PRESP (30), CRESP (25) and DATA (330) together form a 575 bit interface. This interface will be indicated or identified subsequently as 575. As mentioned above, compute elements such as compute elements 300A, 300B, 300C and 300D are substantially non-porous in the sense that connective wire runners unrelated to a particular compute element may not cross the particular compute element's area or real estate on the semiconductor die.

Referring briefly to FIG. 4A before returning to FIGS. 3A-3G, FIG. 4A shows an embodiment of the processor 400 situated on semiconductor die 405. Semiconductor die 405 includes a perimeter 406 with 4 substantially perpendicular sides 406A, 406B, 406C and 406D that form a rectangle. This particular embodiment includes two copies of compute elements 300A, 300B, 300C and 300D that the designer arranges as shown in FIG. 4A. Processor 400 includes a primary interconnect trunk 407 situated along a major axis 410A-410B of processor 400. Primary interconnect trunk 407 includes a centralized bus control element (BC) 420, trunk segments (TS) 421, 422, trunk terminators (TT) 423, 424, and memory control elements (MC) 425, 426. Primary interconnect trunk 407 is a main on-chip interconnect trunk among the eight compute elements 300A, 300A, 300B, 300B, 300C, 300C, 300D, 300D. Processor 400 also includes a secondary interconnect trunk 427 situated along another major axis 430A-430B of processor 400. Major axis 430A-430B is substantially perpendicular to major axis 410A-410B. Secondary interconnect trunk 427 is substantially perpendicular to primary interconnect trunk 407. Secondary interconnect trunk 427 includes nodal SMP link control element (NS) 435 and global SMP link and I/O control element 435 (GS I/O) 440. Processor 400 uses primary interconnect trunk 407 mainly for on-chip or intra-chip communication, for example, communication among compute elements 300A-300D along axis 410A-410B. Processor 400 uses secondary interconnect trunk 427 including NS 435 and GS 440 mainly for off-chip communication, for example, communications between processor 400 and a processor or processors on other integrated circuit (IC) chips. Primary interconnect trunk 407 intersects secondary interconnect trunk 427 at bus control element 420. Processor 400 is discussed in more detail below.

Returning to FIGS. 3A-3G, FIG. 3B shows a simplified pin-out of a trunk segment (TS) such as TS 421 and TS 422. Trunk segment (TS) is a repeatable segment of primary trunk 407 that exhibits a structure to manage intra-chip coherence and data communication. Referring to the enlarged trunk segment (TS) on the left side of FIG. 3B, trunk segment (TS) supports top and bottom connectivity to compute elements. More particularly, trunk segment (TS) includes a 575 bit interface (DATA, CRESP, PRESP, SNOOP, BUS CMD) at the top of trunk segment (TS) for connecting to a compute element. Trunk segment (TS) also includes another 575 bit interface (DATA, CRESP, PRESP, SNOOP, BUS CMD) at the bottom of trunk segment (TS) for connecting to another compute element. Trunk segment (TS) couples in-line with respect to primary interconnect trunk 407 as seen in FIG. 4A. Trunk segment (TS) acts as a pass-through for signals provided thereto and thus acts as a trunk extender. Returning to FIG. 3B, trunk segment (TS) includes a 1165 bit INWARD trunk interface (CMD TRUNK, SNOOP TRUNK, PRESP TRUNK, CRESP TRUNK, DATA TRUNK). Trunk segment (TS) also includes a 1165 bit OUTWARD trunk interface (CMD TRUNK, SNOOP TRUNK, PRESP TRUNK, CRESP TRUNK, DATA TRUNK). The lower right portion of FIG. 3B shows scaled-down versions of trunk segment (TS), namely a trunk segment (TS) 421 exhibiting the same spatial orientation as the enlarged trunk segment (TS) in the upper left of FIG. 3B, and a trunk segment (TS) 422 exhibiting an orientation horizontally flipped or mirrored with respect to trunk segment (TS) 421. Bubbles with a number therein represent the bit widths of the interconnects on each of the four sides of trunk segments 421 and 422. Bubbles with 575 therein represent bit widths for interconnects to top and bottom compute elements (CE) while bubbles with 1165 therein represent interconnects to primary trunk 407. As seen in FIG. 4A, trunk segment (TS) 421 forms part of primary trunk 407 between bus control element (BC) 420 and trunk terminator (TT) 423. Another trunk segment (TS) 422 forms part of primary trunk 407 between bus control element (BC) 420 and trunk terminator (TT) 424.

Figure 3C:
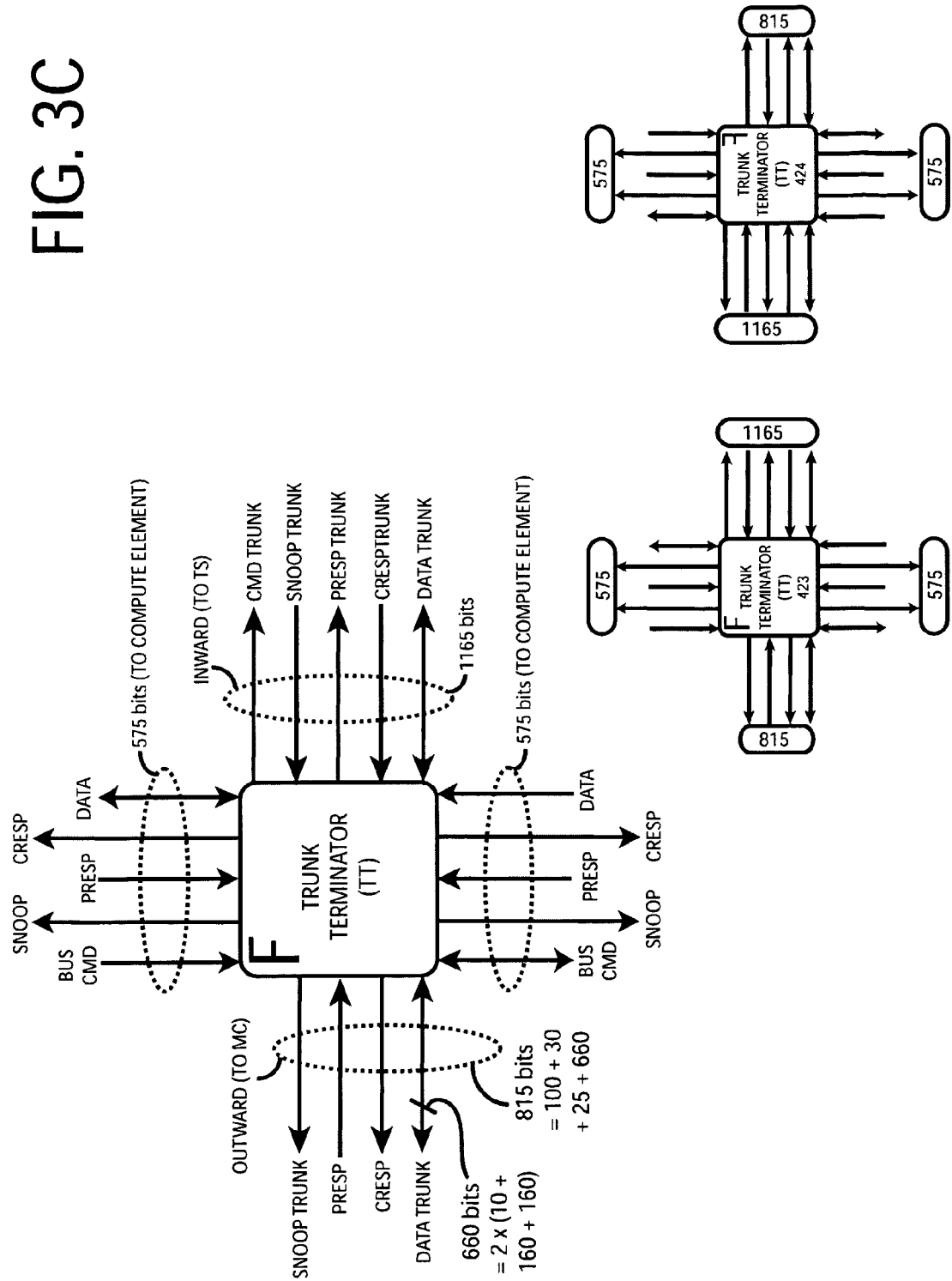
FIG. 3C shows different orientations of a trunk terminator in the processor of the disclosed IHS.

FIG. 3C shows a simplified pin-out of an a trunk terminator (TT) that forms part of primary trunk 407 between a trunk segment (TS) such as TS 421 and a memory control (MC) element 425, as seen in FIG. 4A. Trunk terminator (TT) is a segment of primary trunk 407 that exhibits a structure to manage intra-chip coherence and data communication. A trunk terminator (TT), such as TT 423, supports and terminates primary trunk 407 at a memory controller (MC), such as MC 425, which may be part of primary trunk 407, as discussed below in more detail. Referring to the enlarged trunk terminator (TT) on the left side of FIG. 3C, trunk terminator (TT) supports top and bottom connectivity to compute elements. More particularly, trunk terminator (TT) includes a 575 bit interface (DATA, CRESP, PRESP, SNOOP, BUS CMD) at the top of trunk terminator (TT) for connecting to a compute element. Trunk terminator (TT) also includes another 575 bit interface (DATA, CRESP, PRESP, SNOOP, BUS CMD) at the bottom of trunk terminator (TT) for connecting to another compute element. Trunk terminator (TT) couples in-line with respect to primary interconnect trunk 407 as seen in FIG. 4A. Returning to FIG. 3C, trunk terminator (TT) includes an 1165 bit INWARD trunk interface (CMD TRUNK, SNOOP TRUNK, PRESP TRUNK, CRESP TRUNK, DATA TRUNK). Trunk terminator (TT) also includes a smaller 815 bit OUTWARD trunk interface (SNOOP TRUNK, PRESP TRUNK, CRESP TRUNK, DATA TRUNK) for coupling to a memory controller (MC) element. The lower right portion of FIG. 3C shows scaled-down versions of trunk terminator (TT) namely a trunk terminator (TT) 423 exhibiting the same spatial orientation as the enlarged trunk segment (TS) in the upper left of FIG. 3C, and a trunk terminator (TT) 424 exhibiting an orientation horizontally flipped or mirrored with respect to trunk terminator (TT) 423. Bubbles with a number therein represent the bit widths of the interconnects on each of the four sides of trunk terminators 423 and 424. Bubbles with 575 therein represent bit widths for interconnects to compute elements (CE) while bubbles with 1165 therein represent interconnects inward to a trunk segment of primary trunk 407. Bubbles with an 815 therein represent bit widths for interconnects outward to a memory control element (MC). As seen in FIG. 4A, trunk terminator (TT) 423 forms part of primary trunk 407 between trunk segment (TS) 421 and memory controller element (MC) 425. Another trunk terminator (TT) 424 forms part of primary trunk 407 between trunk segment (TS) 422 and memory controller element (MC) 426.

FIG. 3D shows a simplified pin-out of a memory control element (MC), or other perimeter facing element, that exhibits a structure wherein one side attaches or interconnects to an exterior endpoint segment of primary trunk 407, such as trunk terminator (TT) 423 and 424, as shown in FIG. 4A. Memory controller elements (MC) 425 and 426 are examples of memory controller elements. Another side of a memory control element (MC), such as MC 425 and 426, attaches or interconnects with a perimeter I/O region of processor 400, such as memory buffer link drivers/receivers 445 and 450. In this embodiment, a compute element (CE), such as compute elements 300A-300D, is a master for coherence. A compute element may be a master for coherence commands via a BUS CMD interface added to both memory control elements (MC) and an exterior endpoint segment such as trunk terminator TT. In the embodiment of FIG. 3D, memory control elements (MC) are not masters for coherence. Any element with a BUS CMD interface into primary trunk 407 may be a master for coherence.

Referring to the enlarged memory control element (MC) on the upper left side of FIG. 3D, memory control element (MC) includes an 815 bit INWARD trunk interface (SNOOP, PRESP, CRESP, DATA) that couples to a trunk terminator (TT) such as TT 423, 424. Memory control element (MC) also includes a smaller 600 bit OUTWARD trunk interface (MEM BUF FRAME, MEM BUF FRAME, MEM BUF FRAME, MEM BUF FRAME) for coupling to memory buffer link drivers and receivers. Memory control element (MC) enables I/O to an off-chip memory, i.e. memory (not shown) that is off-chip with respect to processor 400 in one embodiment. The memory control element (MC) of FIG. 3A is a snooper for coherence commands via SNOOP on the 815 bit width INWARD bus. Memory control element (MC) provides partial responses via PRESP on the 815 bit width INWARD bus and reacts to combined responses via CRESP on the 815 bit width INWARD bus.

The lower right portion of FIG. 3D shows scaled-down versions of memory control element (MC) namely a memory control element (MC) 425 exhibiting the same spatial orientation as the enlarged memory control element (MC) in the upper left of FIG. 3D, and a memory control element (MC) 426 exhibiting an orientation horizontally flipped or mirrored with respect to memory control element (MC) 425. Bubbles with a number therein represent the bit widths of the interconnects on each of the two horizontal opposed sides of memory control element (MC) 425 and 426. More particularly, bubbles with 815 therein represent bit widths for interconnects inward to a trunk terminator of primary trunk 407. Bubbles with a 600 therein represent bit widths for interconnects outward to memory buffer link drivers and receivers. As seen in FIG. 4A, memory control element (MC) 425 forms part of primary trunk 407 as an endpoint for primary trunk 407. More particularly, memory control element (MC) 425 couples between trunk terminator (TT) 423 and memory buffer link drivers/receivers 445. A memory 100, shown in dashed lines, couples to memory buffer link driver/receivers 445 to provide off-chip memory to processor 400. In this manner, primary trunk 407 provides I/O for memory transactions with memory 100 via TS 421, TT 423 and MC 425. A memory 100', shown in dashed lines, couples to memory buffer link driver/receivers 450 to provide off-chip memory to processor 400. In this manner, primary trunk 407 provides I/O for memory transactions with memory 100' via TS 422, TT 424 and MC 426. In practice, memory 100 and memory 100' may be the same memory.

FIG. 3E shows a simplified pin-out of a centralized bus control element (BC) 420 that locates at the intersection of primary interconnect trunk 407 and secondary interconnect trunk 427, as seen in FIG. 4A. Bus control element (BC) 420 includes coherence command and data arbiters that manage intra-chip coherence and data communication through primary interconnect trunk 407 in concert with off-chip coherence and data communication through secondary trunk 427. Command arbiter/switch 220 of FIG. 2B and data arbiter 220A of FIG. 2F are an example of such command and data arbiters. Returning to FIG. 4A, on-chip data and communication refers to coherence and data communications that are primarily or mainly on-chip, namely along primary interconnect trunk 407. However, the outer endpoints of primary trunk 407 may communicate with memory 110, 110' that may be off-chip and coupled to memory controllers (MC) 425 and 426 via memory buffer link driver/receivers 445 and 450, respectively.

SMP processor 400 uses secondary interconnect trunk 427 primarily or mainly for off-chip communications, namely communications with SMP processors on integrated circuit (IC) chips other than the chip of processor 400. Secondary trunk 427 includes nodal SMP link control element (NS) 435 and global SMP link control element 440. Nodal SMP link control element (NS) 435 and global SMP link control element 440 couple respectively to nodal SMP link drivers/receivers 455 and global SMP link drivers/receivers 460 to facilitate communication between processor 400 and other SMP processors off-chip with respect to processor 400.

Returning to FIG. 3E, and referring to the enlarged bus control element (BC) 420 shown in the upper left corner thereof, bus control element (BC) 420 includes an 1165 bit primary trunk interface on the left side of BC 420 and an 1165 bit primary trunk interface on the right side of BC 420. These primary trunk interfaces include a CMD TRUNK, SNOOP TRUNK, PRESP TRUNK, CRESP TRUNK and DATA TRUNK interfaces that in total exhibit a bit width of 1165 bits in this particular example. For convenience, FIG. 3E identifies these primary trunk interfaces via their bit widths, namely 1165 bits. BC 420 also includes a 970 bit secondary trunk interface at the top side of BC 420. This 970 bit secondary trunk interface at the top side of BC 420 includes SNOOP, PRESP, CRESP and DATA interfaces which together total 970 bits. BC 420 further includes a 1060 bit secondary trunk interface at the bottom side of BC 420. This 1060 bit secondary trunk interface at the bottom side of BC 420 includes BUS CMD, SNOOP, PRESP, CRESP and DATA interfaces which together total 1060 bits. These secondary trunk interfaces interface with secondary trunk 407.

The lower right portion of FIG. 3E shows a scaled-down version of bus control element (BC) 420 that exhibits the same spatial orientation as the enlarged bus control element (BC) 420 in the upper left of FIG. 3E. Bubbles with a number therein represent the bit widths of the primary and secondary trunk interconnects on each of the four sides of BC 420. More particularly, a bubble with 1165 therein represents the bit width of the primary trunk interconnect on the left side of BC 420 and another bubble with 1165 therein represents the bit width of the primary trunk interconnect on the right side of BC 420. The bubble with 970 therein represents the secondary trunk interconnect on the top side of BC 420. The bubble with 1060 therein represents the secondary trunk interconnect on the bottom side of BC 420.

As seen in FIG. 3E, the 1165 bit on-chip primary trunk interfaces manage coherence requests/grants from bus master elements and accept coherence commands, via CMD TRUNK. The 1165 bit on-chip primary trunk interfaces of BC 420 broadcast commands to all on-chip snoopers via SNOOP TRUNK, and accept PRESPs from all on-chip snoopers via PRESP TRUNK, and broadcast CRESPs to all on-chip bus masters and snoopers via CRESP TRUNK. Any of the elements of processor 400, that FIG. 2A-2G and FIG. 3A-3G depict, may be a bus master or snooper. The 1165 bit on-chip primary trunk interfaces of BC 420 also manage data requests/grants from all senders and transport data along primary trunk 407 using DATA TRUNK.

FIG. 3F shows an enlarged view of nodal SMP link control element (NS) that forms a portion of secondary trunk 427 between bus control element (BC) 420 and nodal SMP link drivers/receivers 455 of FIG. 4A. On the right side of FIG. 3F is a scaled down version of NS 435 including bubbles to indicate the bit widths of the interfaces of NS 435. More particularly, NS 435 includes a 960 bit interface that includes three SMP FRAME interfaces on the top side thereof as seen in FIG. 3F. NS 435 also includes a 970 bit interface including SNOOP, PRESP, CRESP and DATA interfaces.

FIG. 3G shows an enlarged view of global SMP link and I/O control element (GS I/O) that forms a portion of secondary trunk 427 between bus control element (BC) 420 and global SMP link drivers/receivers 460 of FIG. 4A. On the right side of FIG. 3G is a scaled down version of GS I/O 440 including bubbles to indicate the bit widths of the interfaces of GS I/O 440. More particularly, GS I/O 440 includes a 1060 bit interface that includes BUS CMD, SNOOP, PRESP, CRESP and DATA interfaces. GS I/O 440 also two SMP FRAME interfaces and an I/O FRAME interface as indicated by the bit width 960 at the bottom side of GS I/O 440 in FIG. 3G.

The nodal SMP link control element 435 (NS) of FIG. 3F and the global SMP link and I/O control element (GS I/O) 440 of FIG. 3G together form secondary interconnect trunk 427 of FIG. 4A. The off-chip interfaces that NS 435 and GS I/O 440 provide, together with bus control element (BC) 420, manage outbound and inbound coherence commands via SNOOP, inbound and outbound partial responses via PRESP, outbound and inbound complete responses via CRESP and inbound and outbound data via DATA. The I/O control element of GS and I/O 440 provides master functionality in the portion of secondary trunk 427 between bus control element (BC) 420 and global SMP link drivers/receivers 460. The I/O control element of GS and I/O 440 requests and sends coherence commands via BUS CMD and employs the SNOOP, PRESP, CRESP and DATA interfaces of secondary interconnect trunk 427.

Nodal SMP link control element (NS) 435 couples to nodal SMP link drivers/receivers 455 which are adjacent perimeter 406 of processor die 405. Global SMP link and control element (GS I/O) 440 couples to global SMP link drivers/receivers 460 which are also adjacent perimeter 406. SMP drivers/receivers 455 and 460 facilitate off-chip communications with other SMP processors.

As discussed above, each bubble in processor 400 of FIG. 4A represents a bit width of a respective interface that FIGS. 3A-3G depict. In a summary of processor layout, the primary interconnect trunk 407 extends from a centralized bus control element (BC) 420 through the 1165 bit interface of trunk segment (TS) 421 (shown together with arrows), through trunk terminator (TT) 423 to memory control element (MC) 425. The primary interconnect trunk also extends from bus control element (BC) 420 through the 1165 bit interface of trunk segment (TS) 422, through trunk terminator (TT) 424 to memory control element (MC) 426. Memory control elements (MC) 425 and 426 couple to memory buffer link driver/receivers 445 and 450 at opposite sides 406A and 406B, respectively, adjacent perimeter 406 of die 405. Primary interconnect trunk 407 conducts primarily on-chip communications, for example communications from one compute element such as 300A to another compute element such as 300C. Primary interconnect trunk 407 also provides off-chip communications with memory such as memory 100 and memory 100'. The layout of processor 400 also includes a secondary interconnect trunk 427 that is substantially perpendicular to primary interconnect trunk 407, as shown in FIG. 4A for example. Secondary trunk 427 includes NS 435 that extends from bus control (BC) 420 to nodal SMP link drivers/receivers 455. Secondary trunk 427 also includes GS I/O 440 that extends from bus control (BC) 420 to global SMP link drivers/receivers 460. The layout of this particular embodiment of processor 400 locates drivers/receiver 455 and 460 at opposites sides 406C and 406D, respectively, adjacent perimeter 406 of die 405. Secondary interconnect trunk 427 conducts primarily off-chip communications, for example, communications with processors off-chip with respect to processor 400. The layout of this particular embodiment of processor 400 locates bus control element (BC) 420 at the intersection of substantially perpendicular primary interconnect trunk 407 and secondary interconnect trunk 427. Other embodiments may locate the intersection of the primary and secondary trunks, and/or the bus control element (BC) 420, at locations offset with respect to the center of processor 400.

In one embodiment, the layout distributes off-chip I/O interfaces, namely nodal SMP link drivers/receivers 455, along the perimeter 406 at processor side 406C. The layout may also distribute off-chip I/O interfaces, namely global SMP link drivers/receivers 460, along the perimeter 406 at processor side 406D. The layout also distributes off-chip interfaces, such as memory buffer link drivers/receivers 445 and memory buffer link drivers/receivers 450 along perimeter 406 at processor sides 406A and 406B, respectively.

Figure 4B:
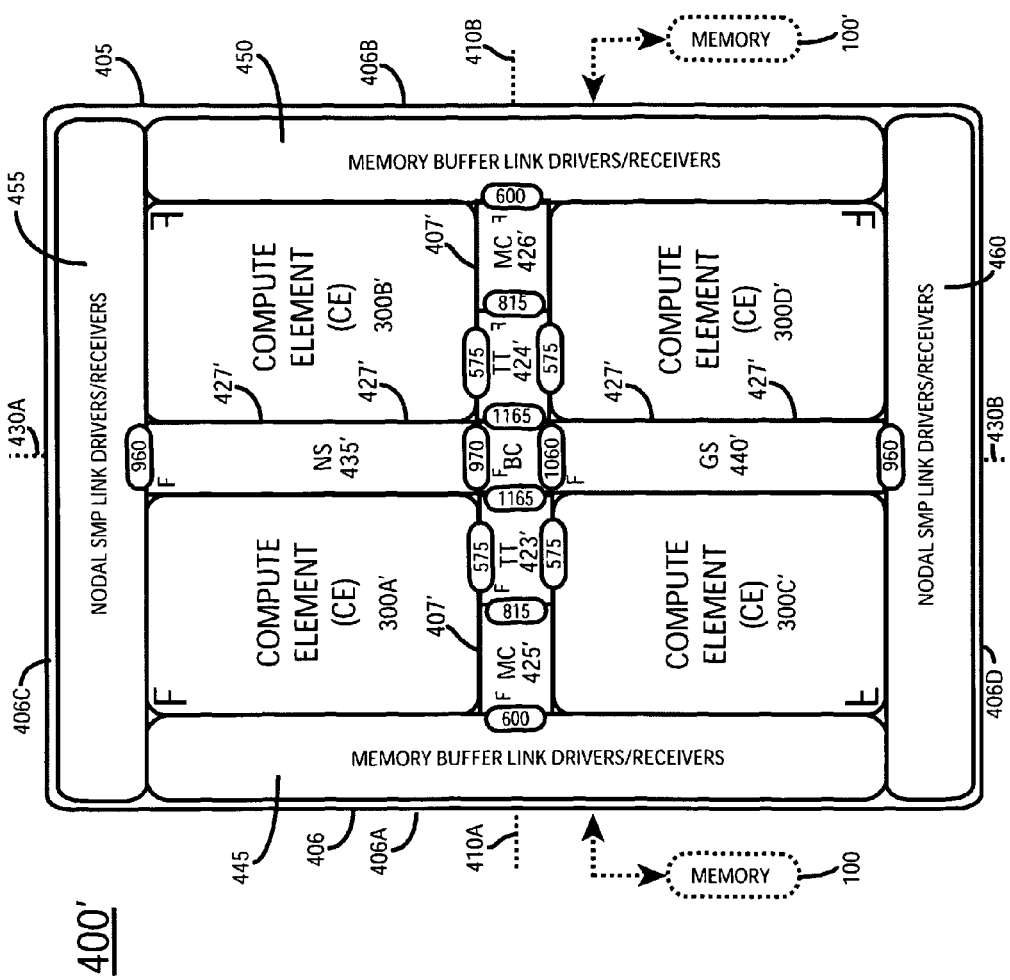
FIG. 4B shows another embodiment of the processor of the disclosed IHS.

FIG. 4B shows an alternative embodiment of processor 400 as processor 400'. Processor 400' of FIG. 4B includes many elements in common with processor 400 of FIG. 4A, with like numbers indicating like elements and like numbers with a prime (') indicating similar elements. The numbers in bubbles again indicate the bit widths of interfaces for respective elements. Processor 400' of FIG. 4B is similar to processor 400 of FIG. 4A, but processor 400' includes four (4) compute elements along primary interconnect trunk 407'. Thus, processor 400' does not employ trunk segments (TS) 421 and 422 to extend the primary interconnect trunk 407'. Processor 400' includes a secondary interconnect trunk 427' that is substantially perpendicular to primary interconnect trunk 407'. Processor 400' uses secondary interconnect trunk 427' for-off chip communication.

FIG. 4C shows another alternative embodiment of processor 400 as processor 400". Processor 400" of FIG. 4C includes many elements in common with processor 400 of FIG. 4A, with like numbers indicating like elements and like numbers with a double prime (") indicating similar elements. The numbers in bubbles again indicate the bit widths of interfaces for respective elements. Processor 400" of FIG. 4C is similar to processor 400 of FIG. 4A, but processor 400" includes twelve (12) compute elements along primary interconnect trunk 407". To accommodate 4 more compute elements than processor 400 of FIG. 4A, processor 400" repeats compute element 300B", compute element 300D" and trunk segment (TS) 421" on the portion of processor 400" between axis 430A-430B and processor die side 406A, as shown in FIG. 4C. For this reason, processor 400" also repeats compute element 300A", compute element 300C" and trunk segment 422" between axis 430A-430B and processor die side 406B, also as shown in FIG. 4C. Processor 400" includes a secondary interconnect trunk 427" that is substantially perpendicular to primary interconnect trunk 407". Processor 400" uses secondary interconnect trunk 427" for-off chip communication.

FIG. 5 shows a high level representation of SMP processor 500 that summarizes worse-case aggregate wire interconnect counts that determine the dimensions of processor 500. In this particular example, processor 500 corresponds to processor 400 of FIG. 4A with like numbers indicating like elements. Processor 500 includes non-porous regions 505, 510, 515 and 520. Non-porous region 505 corresponds to compute elements 300A and 300B of processor 400 of FIG. 4A. Non-porous region 510 corresponds to compute elements 300C and 300D of processor 400 of FIG. 4A. Non-porous region 515 corresponds to compute elements 300A and 300B of processor 400 of FIG. 4A. Non-porous region 520 corresponds to compute elements 300C and 300D of processor 400 of FIG. 4A. In this particular example of FIG. 5, the bit width of primary trunk 407 is 1165 bits and the bit width of secondary trunk 427 is 1060 bits. These bit widths drive the dimensions of a particular processor. The bit widths recited herein are again for example purposes and should not be taking as limiting.

Figure 6:
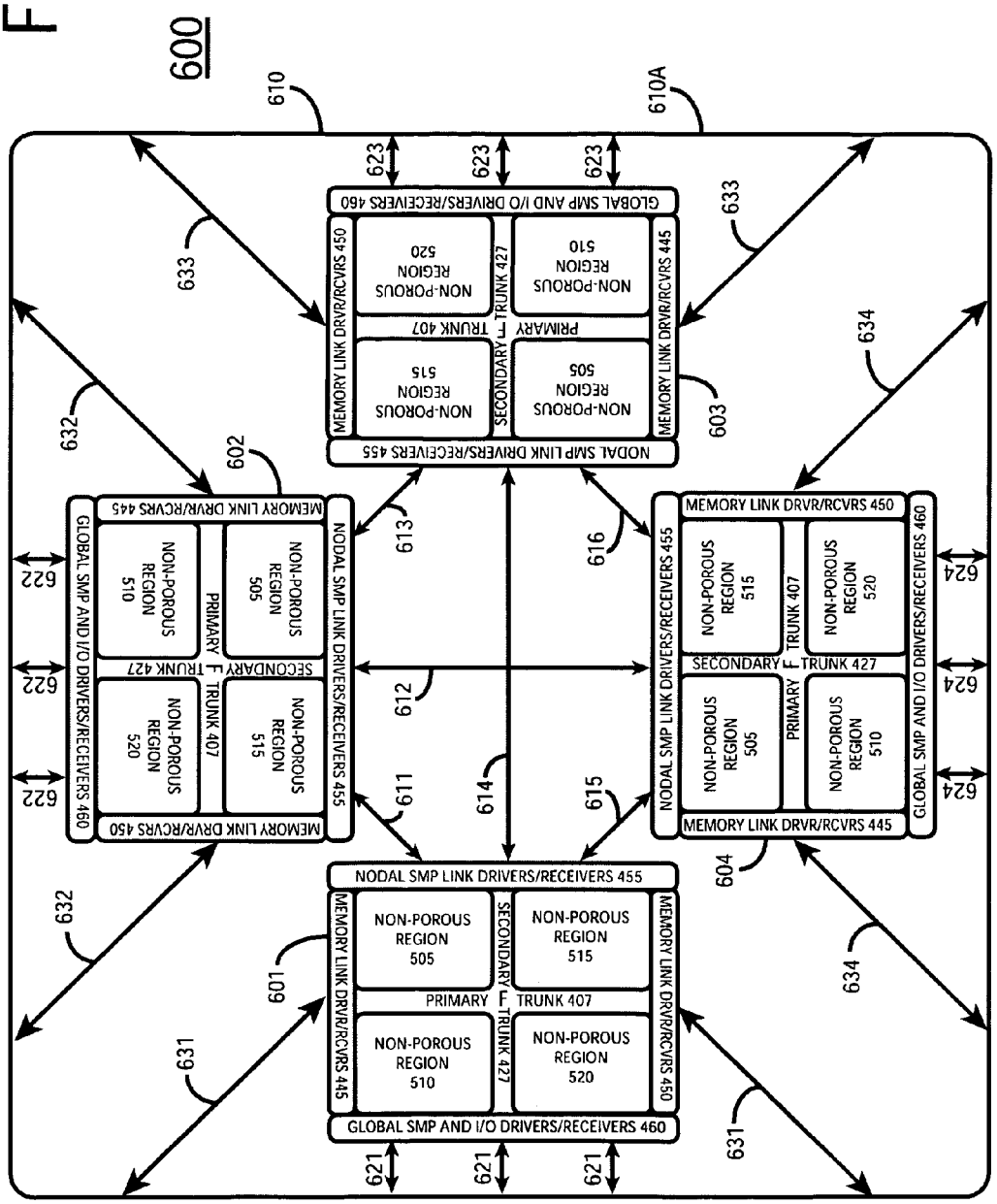
FIG. 6 shows an embodiment including four SMP processors on a common substrate.

FIG. 6 shows a multi-chip package 600 including multiple instances of SMP processor chip 500. In this particular embodiment, multi-chip package 600 includes four SMP processor chips 601, 602, 603 and 604, each of which is an instance of SMP processor 500 of FIG. 5A. The term chip means integrated circuit (IC). Multi-chip package 600 includes a substrate 610 to which processor chips 601-604 attach. Materials suitable for substrate 610 include organic substrate, glass ceramic substrate, or preferably multiple single-chip-carrier organic or glass ceramic substrates mounted on a printed circuit board Substrate 610 includes a perimeter 610A. In this particular embodiment, each of SMP processor chips 601-604 is substantially perpendicular or rotated 90 degrees with respect to immediately neighboring processor chips. The "F" at the center of each processor chip aids in discerning the orientation of each processor chip with respect to other processor chips. For example, processor chip 601 is substantially perpendicular with respect to both of its immediately adjacent neighbors, namely processor chips 602 and 604. Processor chip 602 is substantially perpendicular with respect to both of its immediately adjacent neighbors, namely processor chips 601 and 603. Processor chip 603 exhibits an orientation that is substantially perpendicular with respect to both of its immediately adjacent neighbors, namely processor chips 602 and 604. Processor chip 604 exhibits an orientation that is substantially perpendicular with respect to both of its immediately adjacent neighbors, namely processor chips 601 and 603.

Multi-chip package 600 orients SMP processor chips 601-604 such that the nodal SMP link drivers/receivers 455 of the processor chips face one another toward the center of package 600, such as seen in FIG. 6. The nodal SMP link drivers/receivers of each of processor chips 601-604 couple to the nodal SMP link drivers/receivers of every other processor chip via SMP interconnects such as interconnects 611, 612, 613, 614, 615 and 616. Each of interconnects 611-616 represents an SMP interface with multiple wires or conductors.

Global SMP and I/O drivers/receivers 460 of processor chip 601 couple via interconnects 621 to the perimeter 610A of substrate 610 as seen in FIG. 6. Global SMP and I/O drivers/receivers 460 of processor chip 602 couple via interconnects 622 to the perimeter 610A of substrate 610, also as seen in FIG. 6. Global SMP and I/O drivers/receivers 460 of processor chip 603 couple via interconnects 623 to the perimeter 610A of substrate 610. Global SMP and I/O drivers/receivers 460 of processor chip 604 couple via interconnects 624 to the perimeter 610A of substrate 610. Interconnects 621, 622, 623 and 624 facilitate the coupling of multi-chip package or assembly 600 to other SMP processor packages and assemblies (not shown.) Memory interconnects 631 couple SMP processor chip 601 to off-chip memory (not shown). Memory interconnects 632 couple SMP processor chip 602 to off-chip memory (not shown). Memory interconnects 633 couple SMP processor chip 603 to off-chip memory (not shown). Memory interconnects 634 couple SMP processor chip 604 to off-chip memory (not shown). Each of interconnects 631, 632, 633 and 634 represents an SMP interface with multiple wires or conductors. In one embodiment, multi-chip package 600 is usable as processor 100 of FIG. 1.

Figure 7:
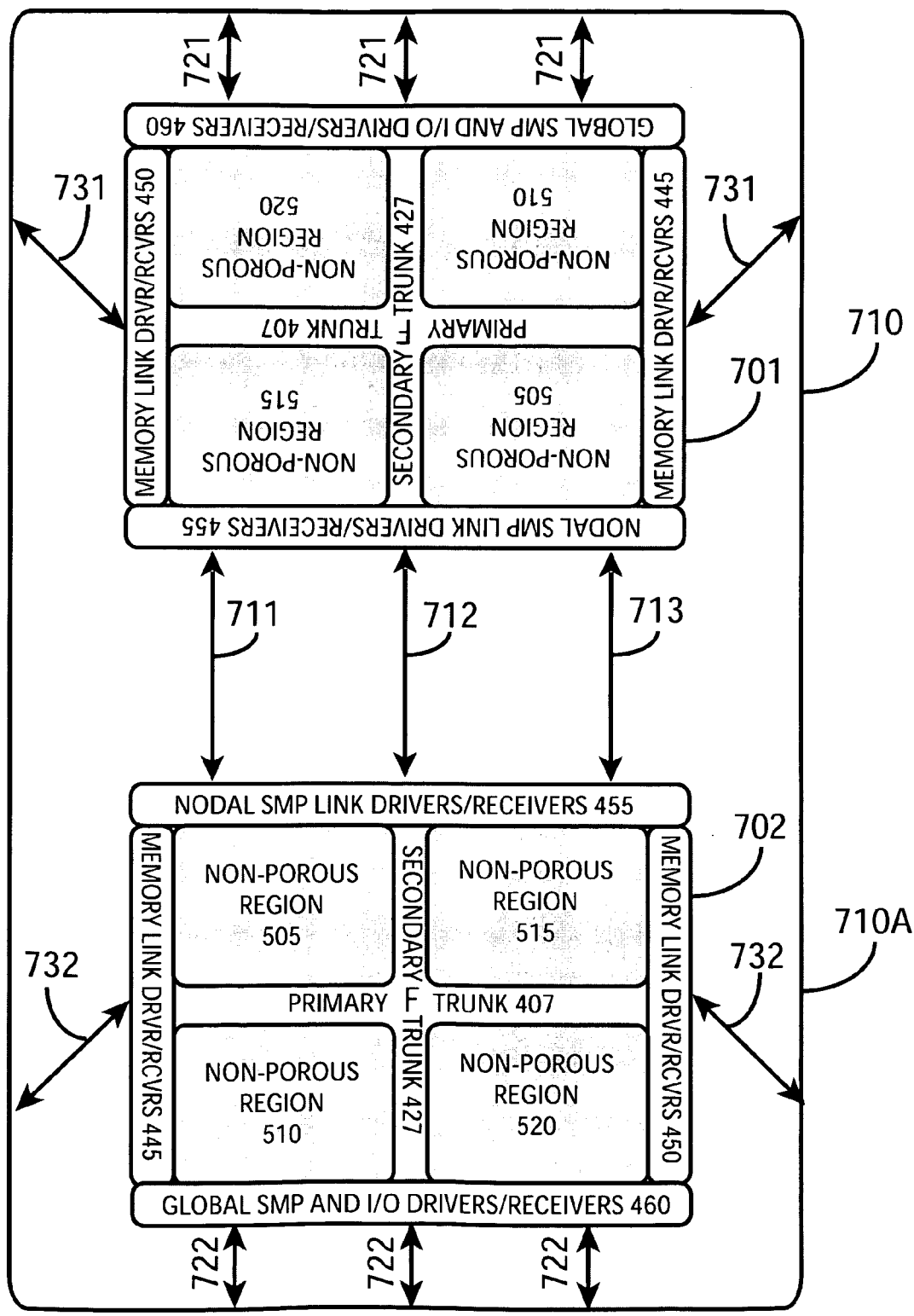
FIG. 7 shows an embodiment including two SMP processors on a common substrate.

FIG. 7 shows a multi-chip package 700 including multiple instances of SMP processor chip 500, namely two instances of processor chip 500. In this particular embodiment, multi-chip package 700 includes SMP processor chips 701 and 702, each of which is an instance of SMP processor 500 of FIG. 5A. Multi-chip package 700 includes a substrate 710 to which processor chips 701 and 702 attach. Materials suitable for substrate 710 include the same material suitable for substrate 610 above in the multi-chip package 600 of FIG. 6. Substrate 710 includes a perimeter 710A. In this particular embodiment, SMP processor chips 701 and 702 exhibit an orientation rotated 180 degrees with respect to one another. The "F" at the center of each processor chip aids in discerning the orientation of processor chip 702 with respect to process chip 701.

Multi-chip package 700 orients SMP processor chips 701 and 702 such that the nodal SMP link drivers/receivers 455 of the processor chips face one another toward the center of package 700, such as seen in FIG. 7. The nodal SMP link drivers/receivers 455 of processor chip 701 couple to the nodal SMP link drivers/receivers 455 of processor chip 702 via SMP interconnects such as interconnects 711, 712 and 713. Each of interconnects 711-713 represents an SMP interface with multiple wires or conductors.

Global SMP and I/O drivers/receivers 460 of processor chip 701 couple via interconnects 721 to the perimeter 710A of substrate 710 as seen in FIG. 7. Global SMP and I/O drivers/receivers 460 of processor chip 702 couple via interconnects 722 to the perimeter 710A of substrate 710, also as seen in FIG. 7. Interconnects 721 and 722 facilitate the coupling of multi-chip package or assembly 700 to other SMP processor packages and assemblies (not shown.) Memory interconnects 731 couple SMP processor chip 701 to off-chip memory (not shown). Memory interconnects 732 couple SMP processor chip 702 to off-chip memory (not shown). Each of interconnects 731 and 732 represents an SMP interface with multiple wires or conductors. In one embodiment, multi-chip package 700 is usable as processor 100 of FIG. 1.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A processor comprising:
   a substrate including a perimeter;
   a plurality of compute elements situated on the substrate;
   a plurality of off-chip I/O interfaces distributed along the perimeter of the substrate;
   a primary interconnect trunk, situated along a first axis of the substrate and coupled to the compute elements, that communicates information to and from the compute elements;
   a secondary interconnect trunk, situated along a second axis of the substrate and intersecting the primary interconnect trunk to form an intersection with the primary interconnect trunk, the secondary interconnect trunk communicating information to and from the plurality of off-chip I/O interfaces to enable off-chip communication, the second axis being substantially perpendicular to the first axis; and
   a bus control element, situated at the intersection of the primary and secondary interconnect trunks, the bus control element including a primary trunk interface that couples to the primary interconnect trunk at the intersection to enable the bus control element to control on-chip communication among the compute elements via coherency signals on the primary interconnect trunk, the bus control element including a secondary trunk interface that couples to the secondary interconnect trunk at the intersection to enable the bus control element to control off-chip communication via coherency signals on the secondary interconnect trunk.

2. The processor of claim 1, wherein the plurality of compute elements is substantially non-porous.

3. The processor of claim 1, wherein the plurality of off-chip I/O interfaces is distributed substantially uniformly along portions of the perimeter of the substrate.

4. The processor of claim 1, wherein the substrate exhibits a rectangular geometry such that the perimeter includes opposed first and second sides and opposed third and fourth sides.

5. The processor of claim 4, wherein the plurality of off-chip I/O interfaces is distributed substantially uniformly along at least two of the first, second, third and fourth sides of the perimeter.

6. The processor of claim 4, wherein the primary interconnect trunk is substantially centrally situated between the opposed first and second sides of the perimeter.

7. The processor of claim 4, wherein the secondary interconnect trunk is substantially centrally situated between the opposed third and fourth sides of the perimeter.

8. The processor of claim 4, wherein the off-chip I/O interfaces include memory control elements, situated along the opposed first and second sides, that communicate with the primary interconnect trunk.

9. The processor of claim 1, wherein the off-chip I/O interfaces include symmetric multi-processor drivers and receivers, situated along the opposed third and forth sides, that communicate with the secondary interconnect trunk.

10. An information handling system (IHS), comprising:
    a first memory;
    a processor, coupled to the first memory, the processor including:
       a substrate including a perimeter;
       a plurality of compute elements situated on the substrate;
       a plurality of off-chip I/O interfaces distributed along the perimeter of the substrate;
       a primary interconnect trunk, situated along a first axis of the substrate and coupled to the compute elements, that communicates information to and from the compute elements;
       a secondary interconnect trunk, situated along a second axis of the substrate and intersecting the primary interconnect trunk to form an intersection with the primary interconnect trunk, the secondary interconnect trunk communicating information to and from the plurality of off-chip I/O interfaces to enable off-chip communication, the second axis being substantially perpendicular to the first axis; and
       a bus control element, situated at the intersection of the primary and secondary interconnect trunks, the bus control element including a primary trunk interface that couples to the primary interconnect trunk at the intersection to enable the bus control element to control on-chip communication among the compute elements via coherency signals on the primary interconnect trunk, the bus control element including a secondary trunk interface that couples to the secondary interconnect trunk at the intersection to enable the bus control element to control off-chip communication via coherency signals on the secondary interconnect trunk.

11. The IHS of claim 10, wherein the plurality of compute elements is substantially non-porous.

12. The IHS of claim 10, wherein the plurality of off-chip I/O interfaces is distributed substantially uniformly along portions of the perimeter of the substrate.

13. The IHS of claim 10, wherein the substrate exhibits a rectangular geometry such that the perimeter includes opposed first and second sides and opposed third and fourth sides.

14. The IHS of claim 13, wherein the plurality of off-chip I/O interfaces is distributed substantially uniformly along at least two of the first, second, third and fourth sides of the perimeter.

15. The IHS of claim 13, wherein the primary interconnect trunk is substantially centrally situated between the opposed first and second sides of the perimeter.

16. The IHS of claim 13, wherein the secondary interconnect trunk is substantially centrally situated between the opposed third and fourth sides of the perimeter.

17. The IHS of claim 13, wherein the off-chip I/O interfaces include memory control elements, situated along the opposed first and second sides, that communicate with the primary interconnect trunk.

18. The IHS of claim 10, wherein the off-chip I/O interfaces include symmetric multi-processor drivers and receivers, situated along the opposed third and forth sides, that communicate with the secondary interconnect trunk.

19. A method comprising:
    communicating information among a plurality of compute elements situated on a substrate that exhibits a perimeter, a plurality of off-chip I/O interfaces being distributed along the perimeter;
    communicating information, by a primary interconnect trunk situated along a first axis of the substrate and coupled to the compute elements, to and from the compute elements;
    communicating information, by a secondary interconnect trunk situated along a second axis of the substrate and intersecting the primary interconnect trunk to form an intersection with the primary interconnect trunk, the secondary interconnect trunk communicating information to and from the plurality of off-chip interfaces to enable off-chip communication, the second axis being substantially perpendicular to the first axis; and controlling information communication, by a bus control element situated at the intersection of the primary and secondary interconnect trunks, the bus control element including a primary trunk interface that couples to the primary interconnect trunk at the intersection to enable the bus control element to control on-chip communication among the compute elements via coherency signals on the primary interconnect trunk, the bus control element including a secondary trunk interface that couples to the secondary interconnect trunk at the intersection to enable the bus control element to control off-chip communication via coherency signals on the secondary interconnect trunk.

20. The method of claim 19, wherein the plurality of compute elements is substantially non-porous.

21. The method of claim 19, wherein the plurality of off-chip I/O interfaces is distributed substantially uniformly along portions of the perimeter of the substrate.

22. The method of claim 19, wherein the substrate exhibits a rectangular geometry such that the perimeter includes opposed first and second sides and opposed third and fourth sides.

23. The method of claim 22, wherein the plurality of off-chip I/O interfaces is distributed substantially uniformly along at least two of the first, second, third and fourth sides of the perimeter.

* * * * *